(12) United States Patent
Liao et al.

(10) Patent No.: US 12,389,641 B2
(45) Date of Patent: Aug. 12, 2025

(54) FIELD EFFECT TRANSISTOR WITH AIR SPACER AND METHOD

(71) Applicant: Taiwan Semiconductor Manufacturing Co., Ltd., Hsinchu (TW)

(72) Inventors: Yi-Bo Liao, Hsinchu (TW); Yu-Xuan Huang, Hsinchu (TW); Cheng-Ting Chung, Hsinchu (TW); Hou-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 628 days.

(21) Appl. No.: 17/580,532

(22) Filed: Jan. 20, 2022

(65) Prior Publication Data
US 2023/0052295 A1 Feb. 16, 2023

Related U.S. Application Data

(60) Provisional application No. 63/233,072, filed on Aug. 13, 2021.

(51) Int. Cl.
*H01L 29/06* (2006.01)
*H01L 29/66* (2006.01)
*H10D 62/10* (2025.01)
*H10D 64/01* (2025.01)

(52) U.S. Cl.
CPC ......... *H10D 62/115* (2025.01); *H10D 64/021* (2025.01)

(58) Field of Classification Search
CPC ....... H01L 21/02603; H01L 21/823431; H01L 21/823821; H01L 21/845; H01L 27/0886; H01L 27/0924; H01L 27/1211; H01L 29/0665; H01L 29/0669; H01L 29/0673; H01L 29/41791; H01L 29/66439; H01L 29/66795; H01L 29/775; H01L 29/785; H01L 29/7851; H01L 29/7853; H01L 29/7855; H01L 2029/7858; H10D 30/014; H10D 30/6735; H10D 62/118; H10D 62/119; H10D 62/121; H10D 64/015; H10D 64/018; H10D 64/021
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |

(Continued)

*Primary Examiner* — David C Spalla
(74) *Attorney, Agent, or Firm* — Seed IP Law Group LLP

(57) ABSTRACT

A device includes a substrate, a gate structure, a capping layer, a source/drain region, a source/drain contact, and an air spacer. The gate structure wraps around at least one vertical stack of nanostructure channels over the substrate. The capping layer is on the gate structure. The source/drain region abuts the gate structure. The source/drain contact is on the source/drain region. The air spacer is between the capping layer and the source/drain contact.

20 Claims, 33 Drawing Sheets

(56) References Cited

U.S. PATENT DOCUMENTS

| | | |
|---|---|---|
| 9,853,101 B2 | 12/2017 | Peng et al. |
| 9,881,993 B2 | 1/2018 | Ching et al. |
| 2020/0105867 A1* | 4/2020 | Lee ................... H01L 23/10 |
| 2020/0105909 A1* | 4/2020 | Wu .................... H10D 30/792 |
| 2020/0127109 A1* | 4/2020 | Wang ............... H01L 21/76895 |
| 2020/0411415 A1* | 12/2020 | Wu ................... H01L 21/76832 |
| 2021/0036122 A1* | 2/2021 | Wong ................ H01L 21/764 |
| 2021/0098592 A1* | 4/2021 | Kang ................. H10D 30/6739 |

* cited by examiner

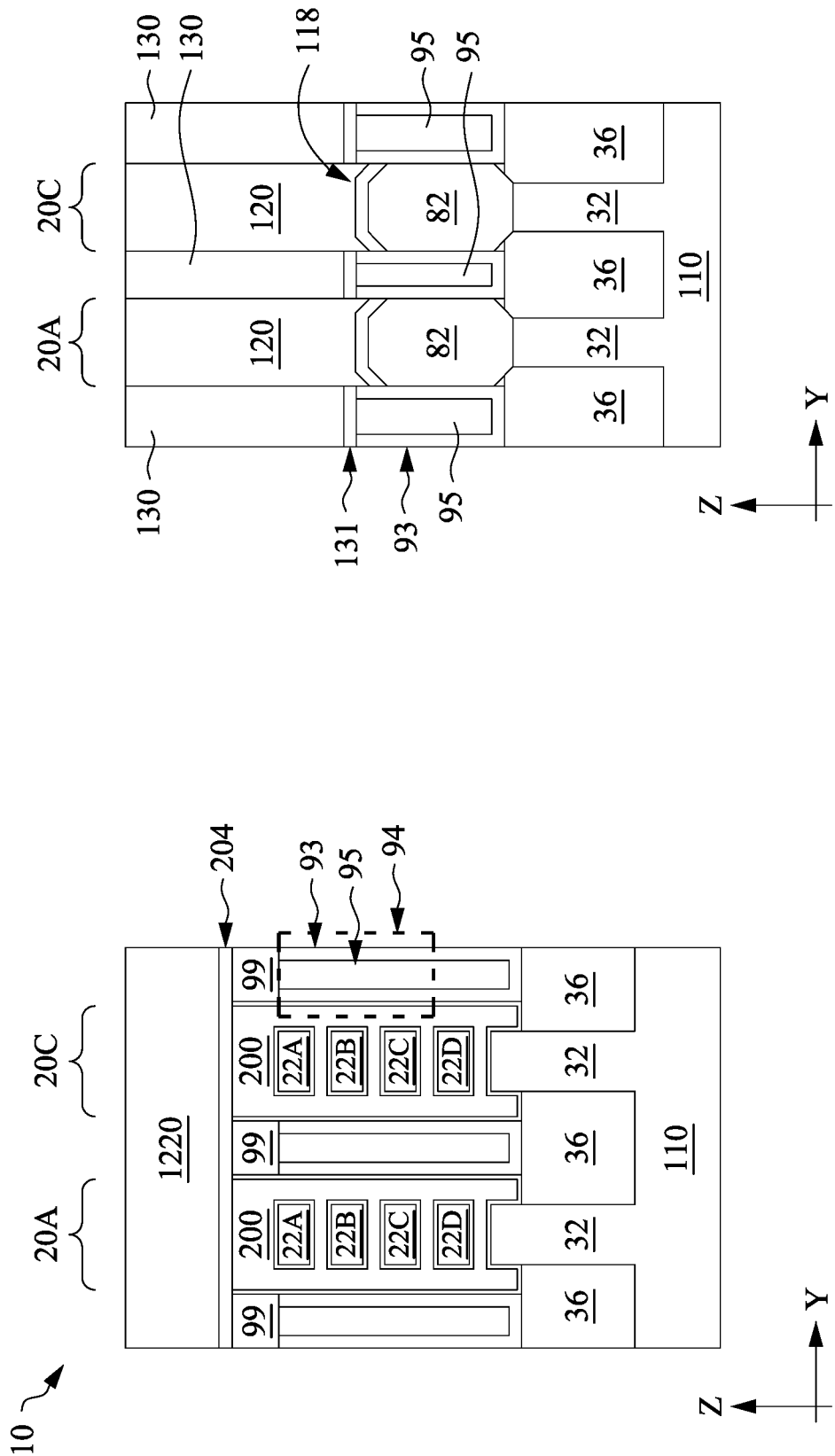

US 12,389,641 B2

FIELD EFFECT TRANSISTOR WITH AIR SPACER AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1H are diagrammatic top and cross-sectional side views of a portion of an IC device fabricated according to embodiments of the present disclosure.

DETAILED DESCRIPTION

Figure 1A:
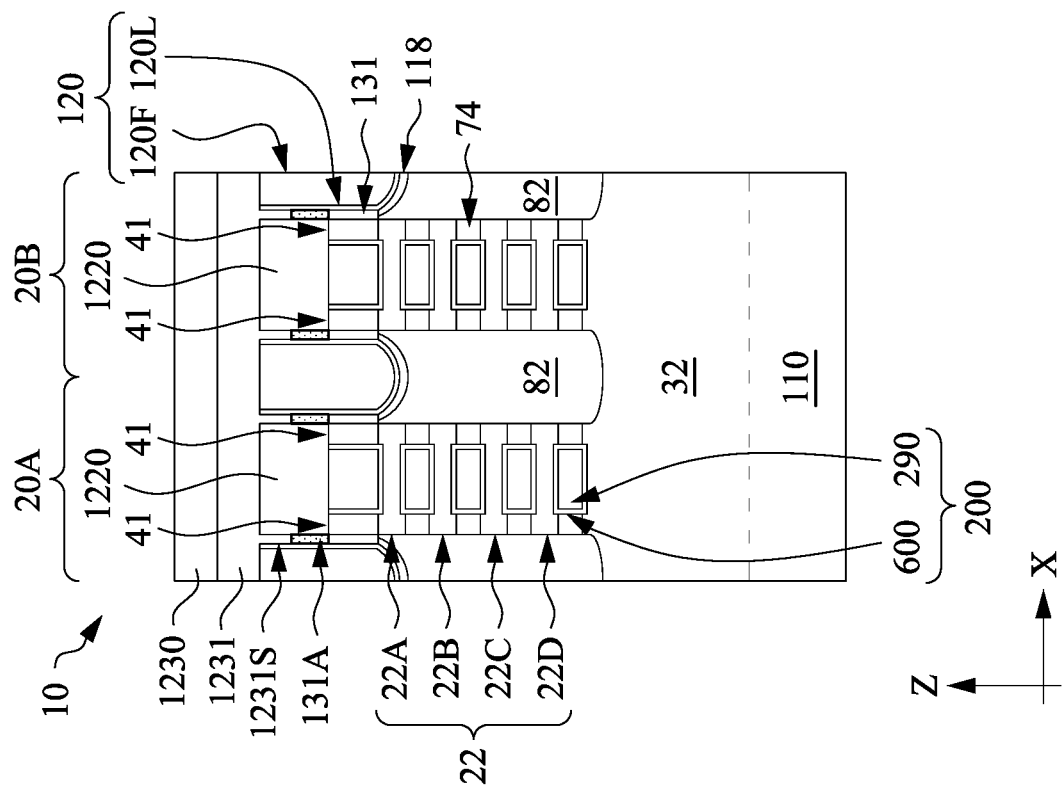

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms. Generally, the term "substantially" indicates a tighter tolerance than the term "about." For example, a thickness of "about 100 units" will include a larger range of values, e.g., 70 units to 130 units (+/−30%), than a thickness of "substantially 100 units," which will include a smaller range of values, e.g., 95 units to 105 units (+/−5%). Again, such tolerances (+/−30%, +/−5%, and the like) may be process- and/or equipment-dependent, and should not be interpreted as more or less limiting than a person having ordinary skill in the art would recognize as normal for the technology under discussion, other than that "about" as a relative term is not as stringent as "substantially" when used in a similar context.

The present disclosure is generally related to semiconductor devices, and more particularly to field-effect transistors (FETs), such as planar FETs, three-dimensional fin-line FETs (FinFETs), or gate-all-around (GAA) devices. In advanced technology nodes, electronic device performance (e.g., speed) may be sensitive to parasitic capacitance, such as middle-end-of-line (MEOL) capacitance $C_{MEOL}$. For $C_{MEOL}$ reduction, lower-k dielectric material may reduce capacitance. However, current materials are insufficient in their ability to reduce $C_{MEOL}$.

Embodiments of the disclosure provide a process which forms an air spacer by use of a removable metal gate hard mask liner. Embodiments also provide an option to replace the metal gate hard mask (or "self-aligned cap," "SAC") after source/drain contact metal filling. Embodiments are compatible with FinFET, GAAFET, and planar FET devices that include a metal gate hard mask (SAC) process. Air spacer thickness can be controlled by liner deposition.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
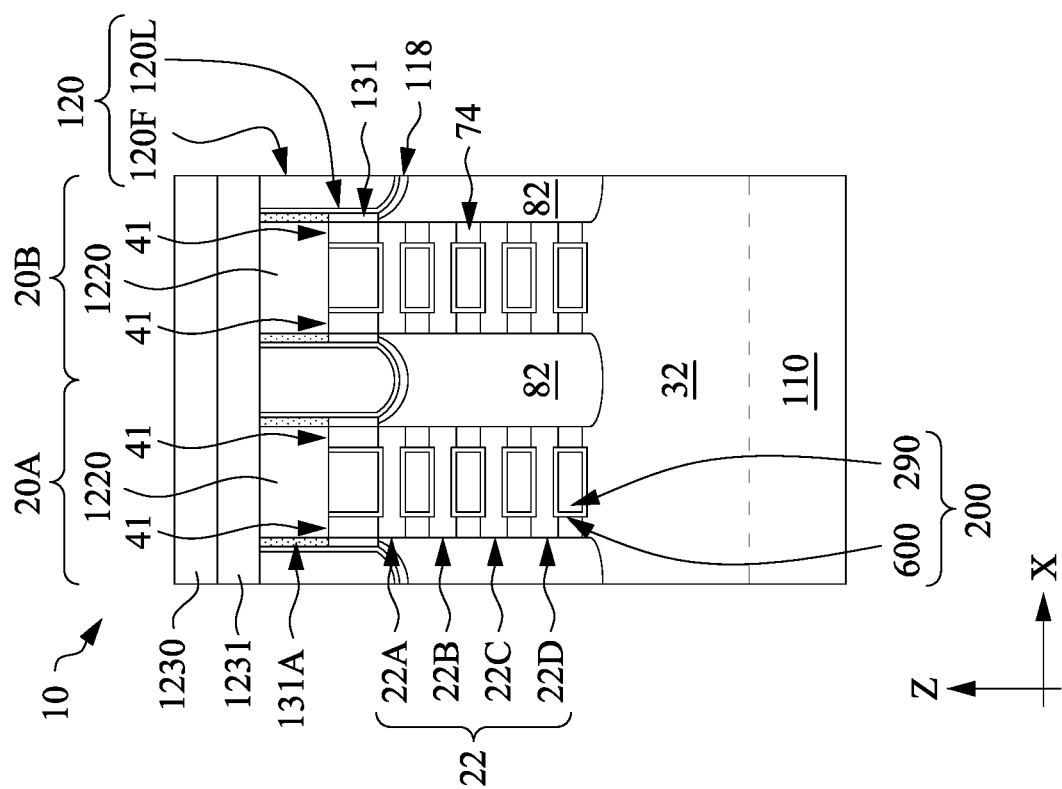
Figure 1C:
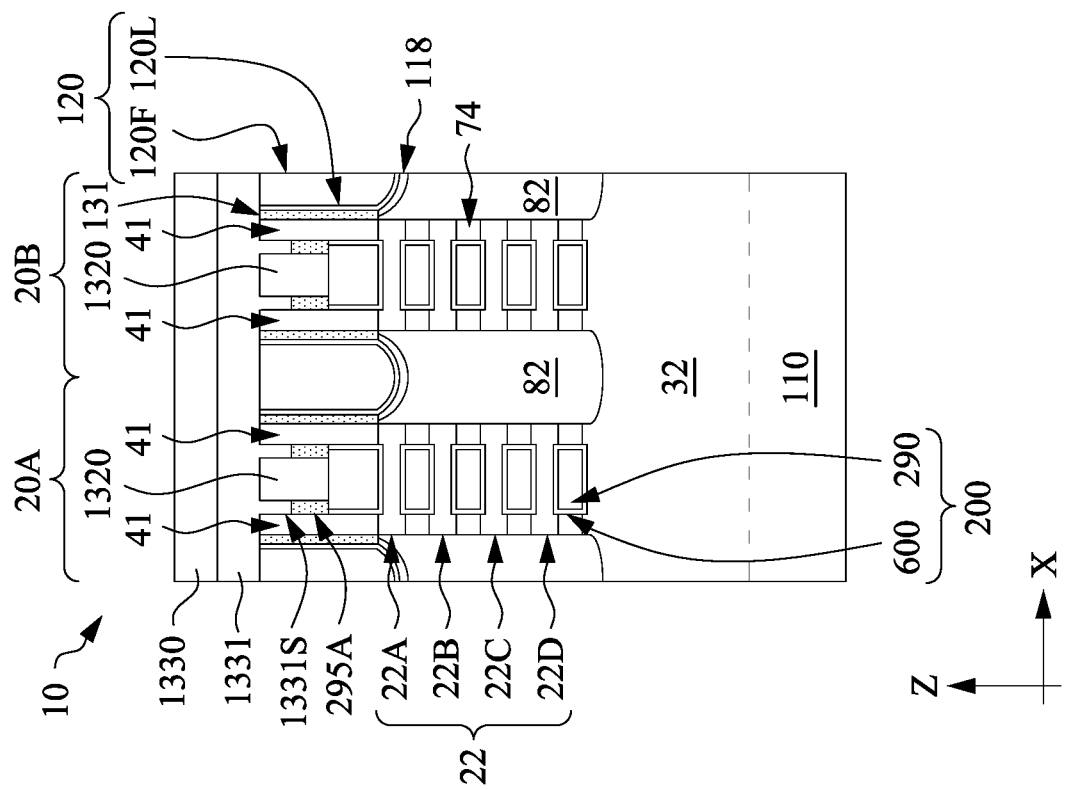
Figure 1D:
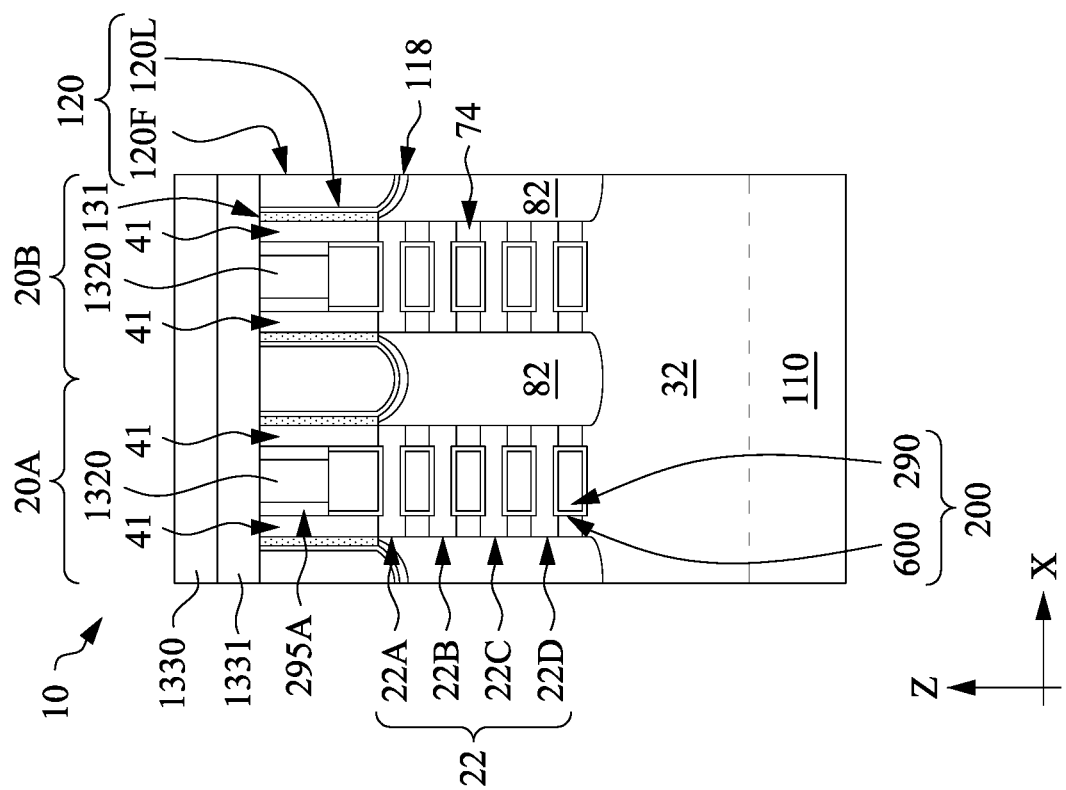
Figure 1G:
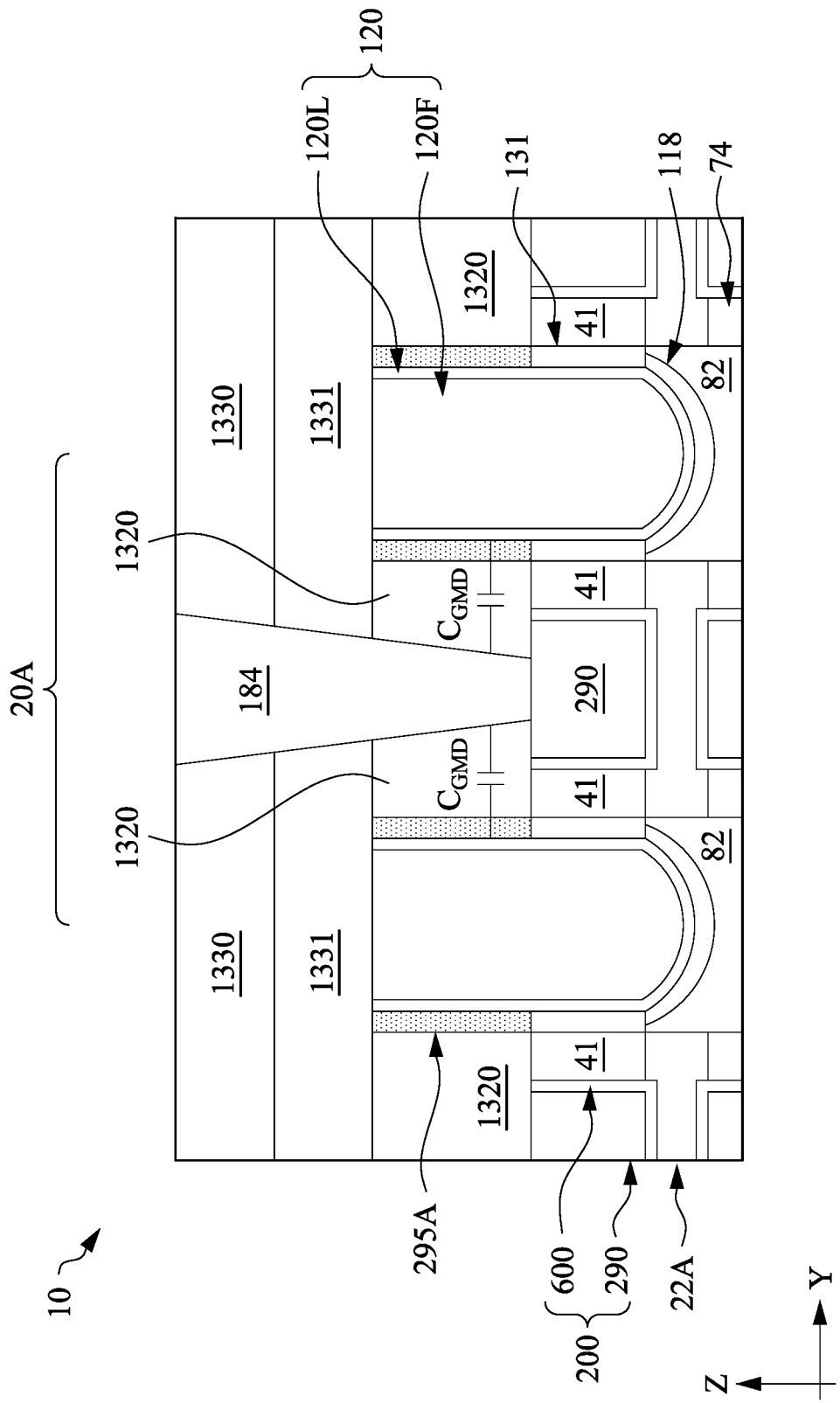

FIGS. 1A-1G illustrate diagrammatic cross-sectional side views of a portion of a gate-all-around (GAA) device 20 in accordance with various embodiments. FIGS. 1A and 1B illustrate views in an X-Z plane, in which an etch stop layer 131 is partially removed and replaced with an air spacer 131A. FIGS. 1C and 1D illustrate views in the X-Z plane, in which a capping layer 295 (or "SAC") is removed and replaced with a narrower capping layer 1320 and an air spacer 295A. FIG. 1E illustrates a view in a Y-Z plane cut through channels 22A-22C, and FIG. 1F illustrates a view in the Y-Z plane cut through source/drain regions 82. FIG. 1G illustrates a view in the Y-Z plan showing a gate via 184 in accordance with various embodiments.

Referring to FIG. 1A, GAA devices 20A-20C (GAA device 20C is shown in FIGS. 1E, 1F) may be or include one or more N-type FETs (NFETs) or P-type FETs (PFETs). The GAA devices 20A-20C are formed over and/or in a substrate 110, and generally include gate structures 200 straddling and/or wrapping around semiconductor channels 22A-22D, alternately referred to as "nanostructures," located over semiconductor fins 32 protruding from, and separated by, isolation structures 36 (see FIG. 1E). The gate structure 200 controls electrical current flow through the channels 22A-22D.

The GAA devices 20A-20C are shown including four channels 22A-22D, which are laterally abutted by source/drain features 82, and covered and surrounded by the gate structure 200. Generally, the number of channels 22 is two or more, such as three or four (FIGS. 1A-1F) or more. The gate structure 200 controls flow of electrical current through the channels 22A-22D to and from the source/drain features 82 based on voltages applied at the gate structure 200 and at the source/drain features 82.

In some embodiments, the fin structure 32 includes silicon. In some embodiments, the GAA devices 20A-20C include an NFET, and the source/drain features 82 thereof include silicon phosphorous (SiP), SiAs, SiSb, SiPAs, SiP:As:Sb, combinations thereof, or the like. In some embodiments, the GAA devices 20A-20C include a PFET, and the source/drain features 82 thereof include silicon germanium (SiGe), either undoped or doped to form, for example, SiGe:B, SiGe:B:Ga, SiGe:Sn, SiGe:B:Sn, or another appropriate semiconductor material. Generally, the source/drain features 82 may include any combination of appropriate semiconductor material(s) and appropriate dopant(s).

The channels 22A-22D each include a semiconductive material, for example silicon or a silicon compound, such as silicon germanium, or the like. The channels 22A-22D are nanostructures (e.g., having sizes that are in a range of a few nanometers) and may also each have an elongated shape and extend in the X-direction. In some embodiments, the channels 22A-22D each have a nanowire (NW) shape, a nanosheet (NS) shape, a nanotube (NT) shape, or other suitable nanoscale shape. The cross-sectional profile of the channels 22A-22D may be rectangular, round, square, circular, elliptical, hexagonal, or combinations thereof.

Figure 3B:
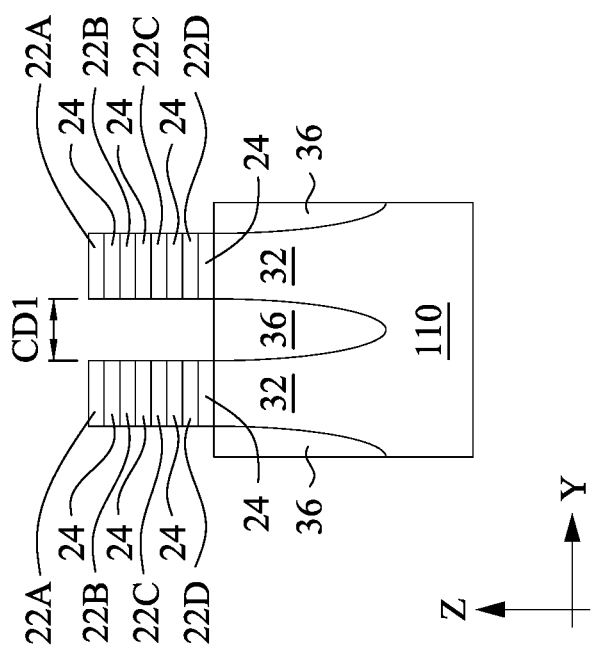
Figure 3A:
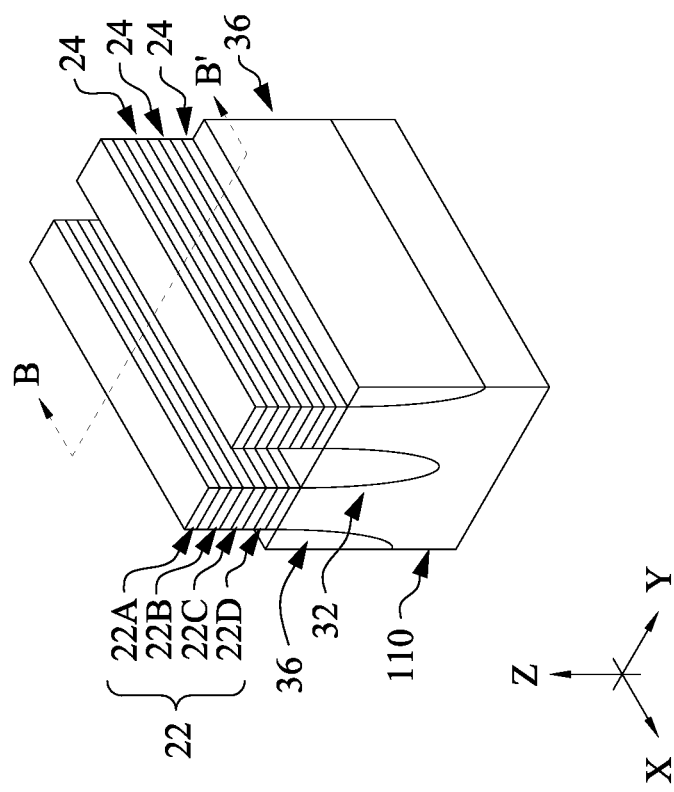

In some embodiments, the lengths (e.g., measured in the X-direction) of the channels 22A-22D may be different from each other, for example due to tapering during a fin etching process (see FIGS. 3A, 3B). In some embodiments, length of the channel 22A may be less than a length of the channel 22B, which may be less than a length of the channel 22C, which may be less than a length of the channel 22D. The channels 22A-22D each may not have uniform thickness (e.g., along the X-axis direction), for example due to a channel trimming process used to expand spacing (e.g., measured in the Z-axis direction) between the channels 22A-22D to increase gate structure fabrication process window. For example, a middle portion of each of the channels 22A-22D may be thinner than the two ends of each of the channels 22A-22D. Such shape may be collectively referred to as a "dog-bone" shape, and is illustrated in FIG. 1A.

In some embodiments, the spacing between the channels 22A-22D (e.g., between the channel 22B and the channel 22A or the channel 22C) is in a range between about 8 nanometers (nm) and about 12 nm. In some embodiments, a thickness (e.g., measured in the Z-direction) of each of the channels 22A-22D is in a range between about 5 nm and about 8 nm. In some embodiments, a width (e.g., measured in the Y-direction, shown in FIG. 1E, orthogonal to the X-Z plane) of each of the channels 22A-22D is at least about 8 nm.

The gate structure 200 is disposed over and between the channels 22A-22D, respectively. In some embodiments, the gate structure 200 is disposed over and between the channels 22A-22D, which are silicon channels for N-type devices or silicon germanium channels for P-type devices. In some embodiments, the gate structure 200 includes an interfacial layer (IL) 210, one or more gate dielectric layers 600, one or more work function tuning layers 900 (see FIG. 14), and a metal fill layer 290.

The interfacial layer 210, which may be an oxide of the material of the channels 22A-22D, is formed on exposed areas of the channels 22A-22D and the top surface of the fin 32. The interfacial layer 210 promotes adhesion of the gate dielectric layers 600 to the channels 22A-22D. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

In some embodiments, the gate dielectric layer 600 includes at least one high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 600 has thickness of about 5 A to about 100 A.

In some embodiments, the gate dielectric layer 600 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., 10 transistors) is devoid of the dopant that is present in certain other transistor devices (e.g., N-type core logic transistors or P-type 10 transistors). In N-type 10 transistors, for example, relatively high threshold voltage is desirable, such that it may be preferable for the 10 transistor high-k dielectric layers to be free of lanthanum ions, which would otherwise reduce the threshold voltage.

In some embodiments, the gate structure 200 further includes one or more work function metal layers, represented collectively as work function metal layer 900. When configured as an NFET, the work function metal layer 900 of the GAA device 20 may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TiN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TiN, WN, MoN, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200 also includes metal fill layer 290. The metal fill layer 290 may include a conductive material such as Co, W, Ru, combinations thereof, or the like. In some embodiments, the metal fill layer 290 is or includes a Co-, W- or Ru-based compound or alloy including one or more elements, such as Zr, Sn, Ag, Cu, Au, Al, Ca, Be, Mg, Rh, Na, Ir, W, Mo, Zn, Ni, K, Co, Cd, Ru, In, Os, Si, Ge, Mn, combinations thereof, or the like. Between the channels 22A-22D, the metal fill layer 290 is circumferentially surrounded (in the cross-sectional view) by the one or more work function metal layers 900, which are then circumferentially surrounded by the gate dielectric layers 600, which are circumferentially surrounded by the interfacial layer 210. The gate structure 200 may also include a glue layer that is formed between the one or more work function layers 900 and the metal fill layer 290 to increase adhesion. The glue layer is not specifically illustrated in FIGS. 1A, 1B for simplicity.

The GAA device 20 may further include source/drain contacts 120 (shown in FIGS. 1A, 1B; collectively referred to as "source drain contacts 120") that are formed over the source/drain features 82. The source/drain contacts 120 may include a fill layer 120F that is or includes a conductive material such as tungsten, ruthenium, cobalt, copper, titanium, titanium nitride, tantalum, tantalum nitride, iridium, molybdenum, nickel, aluminum, or combinations thereof. The source/drain contacts 120 may be surrounded by liner (or, "barrier") layers 120L, such as SiN or TiN, which help prevent or reduce diffusion of materials from and into the source/drain contacts 120. In some embodiments, height of the source/drain contacts 120 may be in a range of about 1 nm to about 50 nm.

Silicide layers 118 are formed between the source/drain features 82 and the source/drain contacts 120, at least to reduce the source/drain contact resistance. In some embodiments, the silicide layer 118 is or includes TiSi, CrSi, TaSi, MoSi, ZrSi, HfSi, ScSi, Ysi, HoSi, TbSI, GdSi, LuSi, DySi, ErSi, Yb Si, or the like. In some embodiments, the silicide layer 118 is or includes NiSi, CoSi, MnSi, Wsi, FeSi, RhSi, PdSi, RuSi, PtSi, IrSi, OsSi, or the like. The silicide layer 118 may have thickness in a range of about 1 nm to about 10 nm. Thickness lower than about 1 nm may lead to an insufficient reduction in contact resistance. Thickness above about 10 nm may cause electrical shorting with the nanostructures 22. In some embodiments, the silicide layer 118 is present below, and in contact with, etch stop layer 131, as shown in FIGS. 1A-1D.

As shown in FIG. 1F, the GAA device 20 further includes an interlayer dielectric (ILD) 130. The ILD 130 provides electrical isolation between the various components of the GAA device 20 discussed above, for example between neighboring pairs of the source/drain contacts 120. An etch stop layer 131, shown in FIGS. 1A-1D, 1F, may be formed prior to forming the ILD 130, and may be positioned laterally between the ILD 130 and the gate spacers 41 and vertically between the ILD 130 and the source/drain features 82. In some embodiments, the etch stop layer 131 is or includes SiN, SiCN, SiC, SiOC, SiOCN, HfO2, ZrO2, ZrAlOx, HfAlOx, HfSiOx, Al2O3, or other suitable material. In some embodiments, thickness of the etch stop layer is in a range of about 1 nm to about 10 nm. In some embodiments, where the ILD 130 is not present (e.g., is removed completely prior to formation of the source/drain contacts 120), the etch stop layer 131 may be in contact with the source/drain contact 120. The etch stop layer 131 may be trimmed, for example, in the X-axis direction prior to formation of the source/drain contact 120 to improve fill quality of the source/drain contact 120.

Overlying the gate dielectric layer 600 and the gate fill layer 290 are an optional first capping layer 204 (see FIG. 1E) and a second capping layer 1220 (FIGS. 1A, 1B, 1E) or a second capping layer 1320 (FIGS. 1C, 1D). The first capping layer 204 protects the gate structure 200. In some embodiments, the first capping layer 204 is or includes a dielectric material, such as SiO2, SiN, SiCN, SiOCN, a high-k dielectric material (e.g., Al2O3), or the like. In some embodiments, the first capping layer 204 has thickness (e.g., in the Z-axis direction) in a range of about 1 nm to about 10 nm. The first capping layer 204 may prevent current leakage following one or more etching operations, which may be performed to form gate contacts or gate via 184 (see FIG. 1G), source/drain contacts 120, isolation structures (e.g., source/drain contact isolation structures), or the like. In some embodiments, the first capping layer 204 is or comprises a dielectric material that is harder than, for example, the second capping layer 1220, 1320, such as aluminum oxide, or other suitable dielectric material.

Figure 11B:
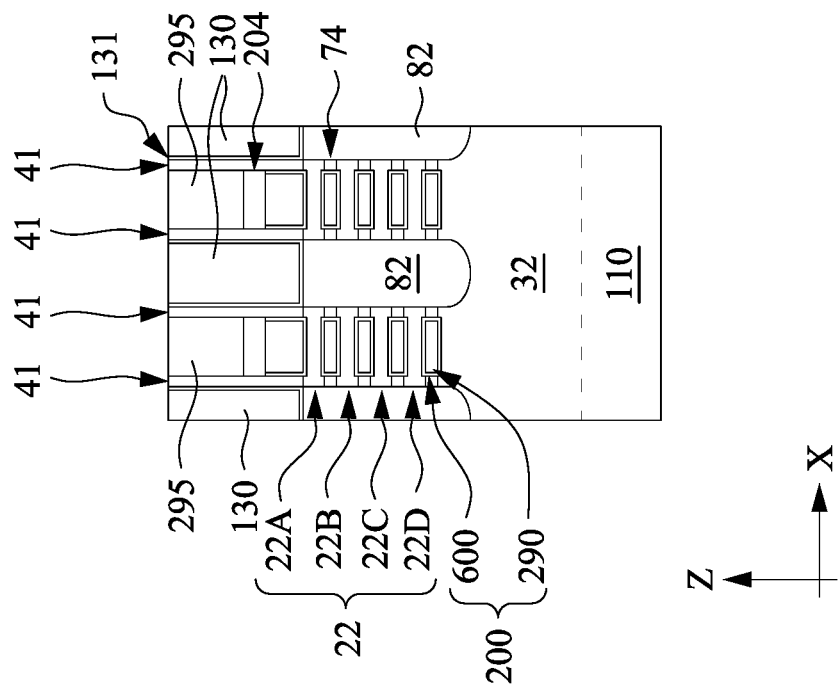
Figure 12B:
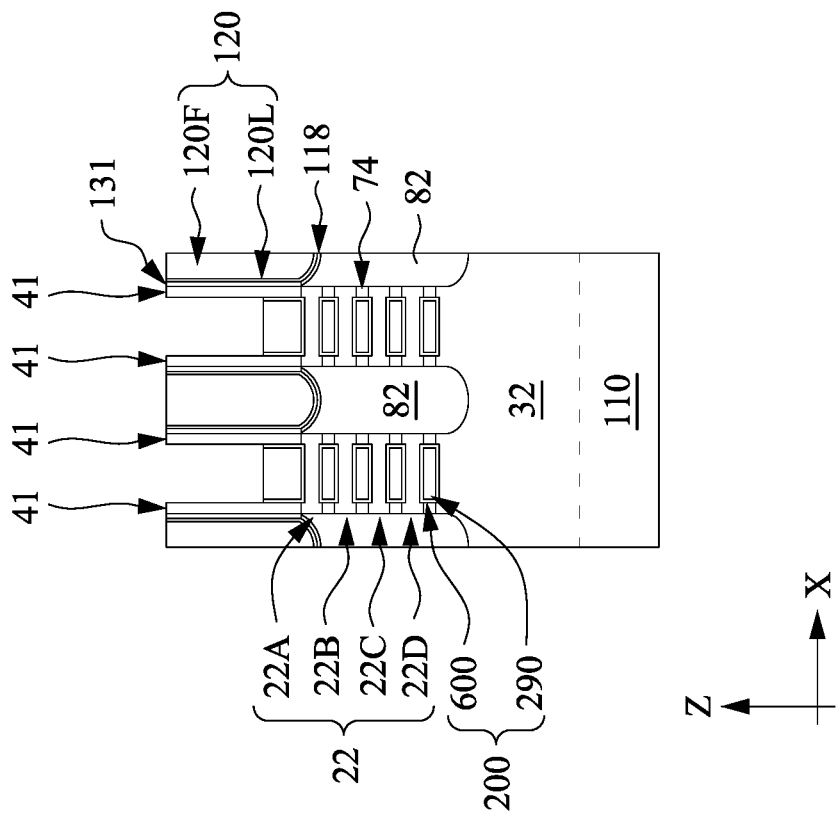
Figure 12A:
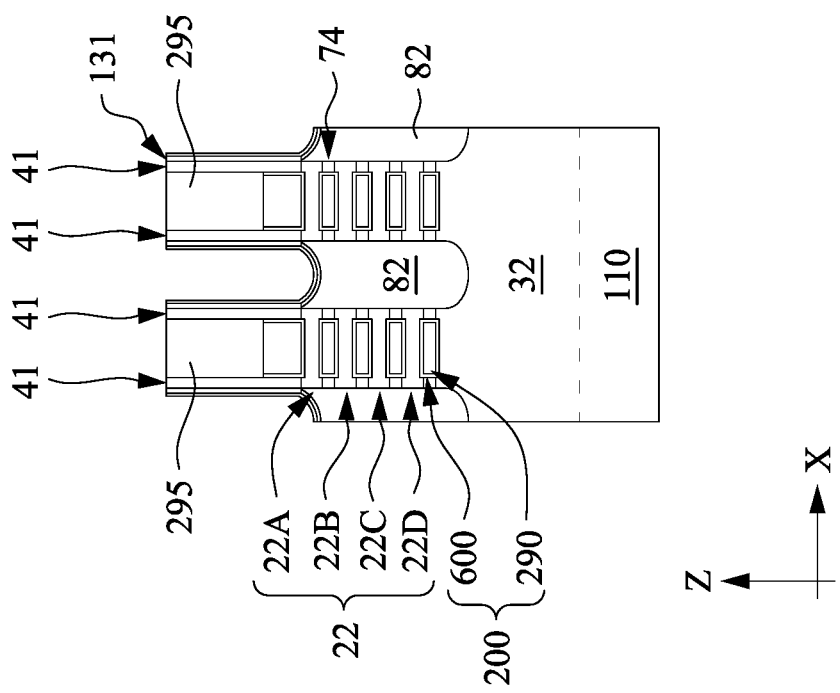
Figure 13B:
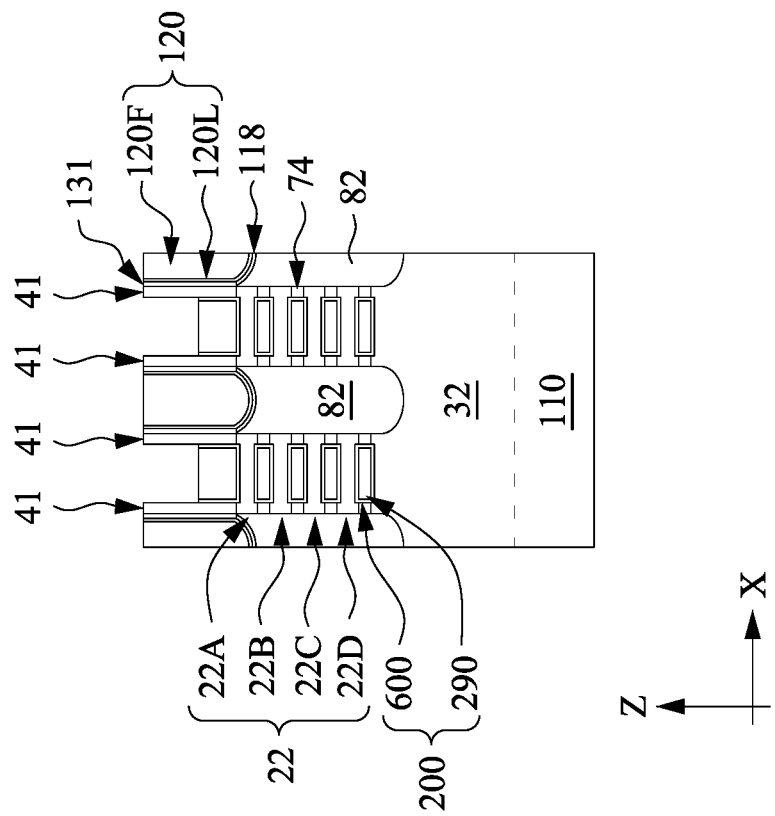
Figure 13A:
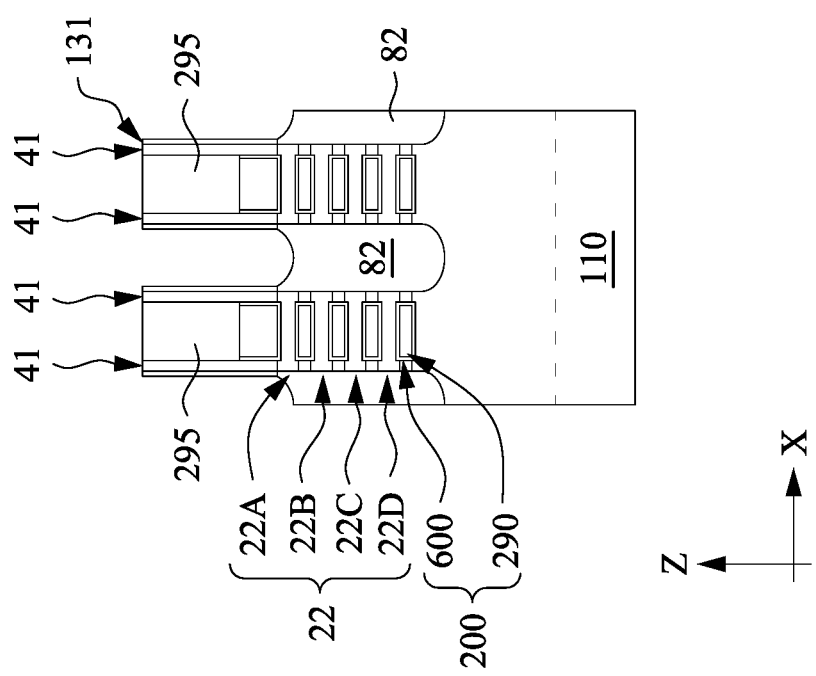

The second capping layer 1220, 1320 may be a replacement capping layer, which replaces a second capping layer 295 (see FIG. 11B, 12A, 13A). Each of the second capping layers 295, 1220, 1320 may also be referred to as a "self-aligned capping" (SAC) layer, and may provide protection to the underlying gate structure 200. The second capping layer 295 may act as a CMP stop layer when planarizing the source/drain contacts 120 following formation thereof. The second capping layers 295, 1220, 1320 may be dielectric layers including a dielectric material, such as SiO2, SiN, SiCN, SiC, SiOC, SiOCN, HfO2, ZrO2, ZrAlOx, HfAlOx, HfSiOx, Al2O3, BN, or other suitable dielectric material. In some embodiments, over longer gate structures and channels, the second capping layer 295, 1220, 1320 may be split by a support structure. In some embodiments, width (X direction) of the second capping layers 295, 1220, 1320 is in a range of about 8 nm to about 40 nm.

The GAA devices 20A-20C include gate spacers 41 that are disposed on sidewalls of the gate dielectric layer 600 and the IL 210 above the channel 22A, and inner spacers 74 that are disposed on sidewalls of the IL 210 between the channels 22A-22D. The inner spacers 74 are also disposed between the channels 22A-22D. The gate spacers 41 and the inner spacers 74 may include a dielectric material, for example a low-k material such as SiOCN, SiON, SiN, or SiOC. In some embodiments, one or more additional spacer layers are present abutting the gate spacers 41. The gate spacers 41 may have different height depending on configuration of the air spacers 131A, 295A shown in FIGS. 1A, 1B or FIGS. 1C, 1D, respectively. As shown in FIGS. 1A, 1B, the gate spacers 41 extend from upper surfaces of the channels 22A to lower surfaces of the second capping layers 1220. Upper surfaces of the gate spacers 41 are generally coplanar with upper surfaces of the gate structures 200 in the configuration shown in FIGS. 1A, 1B. In FIGS. 1C, 1D, the gate spacers 41 extend from the upper surfaces of the channels 22A to upper surfaces of the second capping layers 1320 and the source/drain contacts 120. The upper surfaces of the gate spacers 41 extend past the upper surfaces of the gate structures 200 in the configuration shown in FIGS. 1C, 1D.

The air spacers 131A, 295A (or "air gaps," or "cavities") are present between the source/drain contacts 120 and the second capping layers 1220, 1320, respectively. The air spacers 131A, 295A reduce MEOL capacitance $C_{MEOL}$, at least by reducing dielectric constant by replacing portions of the ESL 131 or the second capping layer 295A with air. The reduction in $C_{MEOL}$ may be as great as 3% or more compared to configurations in which the air spacers 131A, 295A are not present. In some embodiments, shown in FIGS. 1A, 1C, the air spacers 131A, 295A have height in the Z-axis direction that is substantially the same as height of the second capping layers 1220, 1320, respectively. The height of the air spacers 131A, 295A may be in a range of about 5 nm to about 40 nm. Width of the air spacers 131A, 295A may be in a range of about 1 nm to about 10 nm.

In some embodiments, illustrated in FIGS. 1B, 1D, seal (or "extension") portions 1231S, 1331S of second ESLs 1231, 1331 overlying the source/drain contacts 120 and the second capping layers 1220, 1320 extend partially into gaps between the second capping layers 1220, 1320 and the source/drain contacts 120 (FIG. 1B) or the spacer layer 41 (FIG. 1D). In some embodiments, the seal portions 1231S, 1331S have height in a range of about 0 nm (FIGS. 1A, 1D) to about 10 nm. Width of the seal portions 1231S, 1331S may be in a range of about 1 nm to about 10 nm. In some embodiments, the second ESLs 1231, 1331 including the seal portions 1231S, 1331S are or include SiN, SiCN, SiOCN. Second ILDs 1230, 1330 overlie the second ESLs 1231, 1331, respectively, and may be or comprise similar materials as the ILD 130.

Pullback of gate spacers 41 and ESL 131 may be measured along the X-axis direction (e.g., width) and the Z-axis direction (e.g., height). In FIGS. 1A, 1B, the gate spacers 41 and the etch stop layer 131 are pulled back in height by about the same dimension as height of the second capping layer 1220. In some embodiments, as shown in FIGS. 1C, 1D, the gate spacers 41 and the ESL 131 are not pulled back, corresponding to zero reduction in height. Along the X-axis direction, width of the gate spacers 41 and the ESL 131 combined may be pulled back by about 0 nm (FIGS. 1C, 1D) to about 15 nm.

FIG. 1G is a detailed view of the device 10 including a gate via 184 (or "gate contact") in contact with the gate structure 200 of the GAA device 20A. The gate via 184 is in contact with the metal fill layer 290, and extends through the second capping layer 1220, 1320 (the second capping layer 1320 is shown in FIG. 1G). The gate via 184 extends through the second ILD 1230, 1330 and the second ESL 1231, 1331, as shown. By including the air spacer 295A or the air spacer 131A, parasitic capacitance $C_{MEOL}$ between the gate via 184 and the neighboring source/drain contacts 120 is reduced, which increases speed performance of the GAA device 20A. The parasitic capacitance $C_{MEOL}$ may include capacitances $C_{GMD}$ between the gate via 184 and the source/drain contacts 120, illustrated in FIG. 1G. When the gate via 184 is not present over the gate structure 200, as illustrated in FIG. 1H, the capacitances $C_{GMD}$ may be fringe capacitances between the source/drain contacts 120 and the gate structure 200.

Figure 1H:
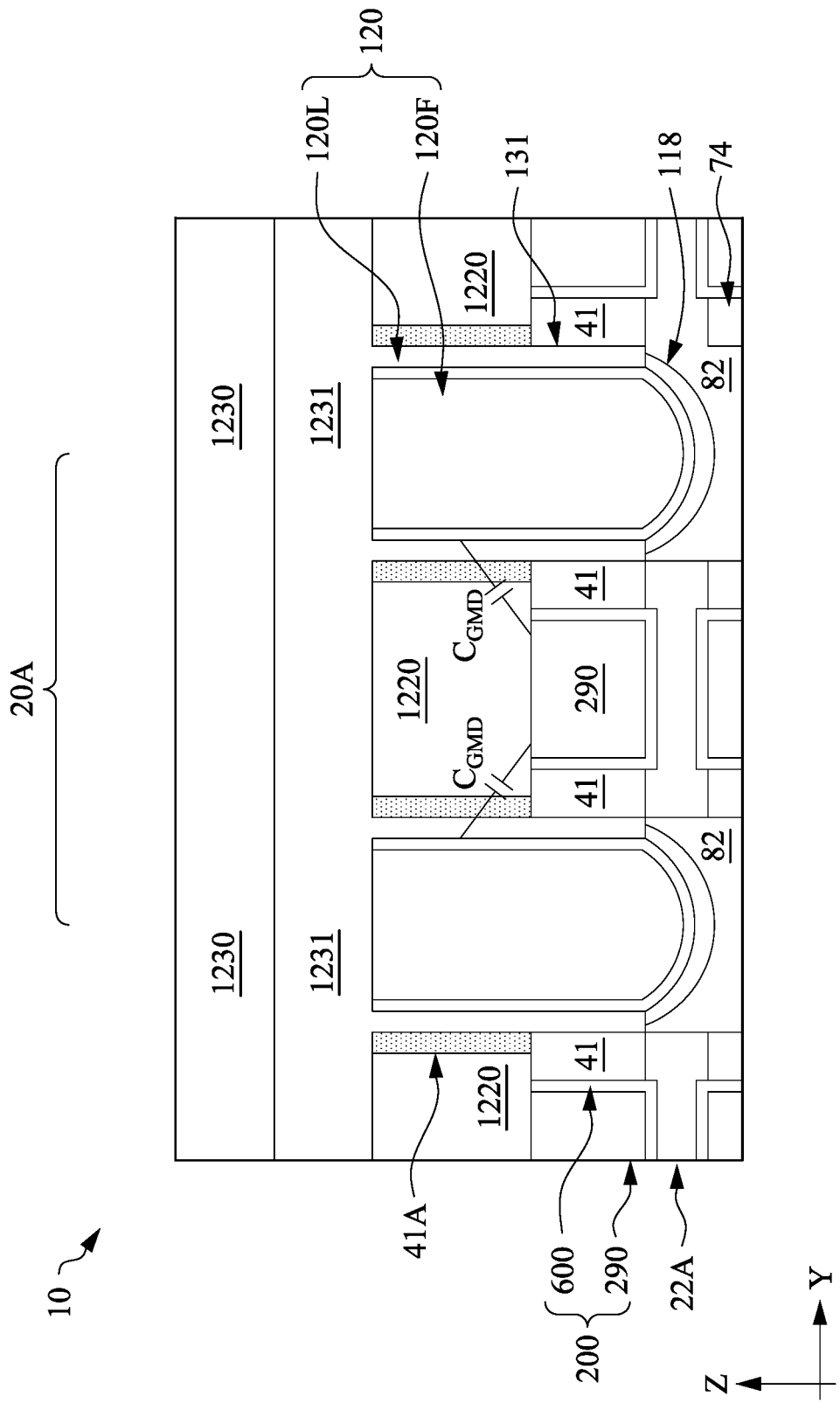

FIG. 1H illustrates an embodiment in which an air spacer 41A replaces a portion of the gate spacer 41. The air spacer 41A is similar in many respects to the air spacers 295A, 131A, which are described with reference to FIGS. 1A-1D. The air spacer 41A contacts the second capping layer 1220, the gate spacer 41, the ESL 131 and the second ESL 1231. Inclusion of the air spacer 41A reduces $C_{MEOL}$, such as the fringe capacitances $C_{GMD}$, which increases speed of the device 10.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, the disclosures of each which are hereby incorporated by reference in their respective entireties.

Figure 14:
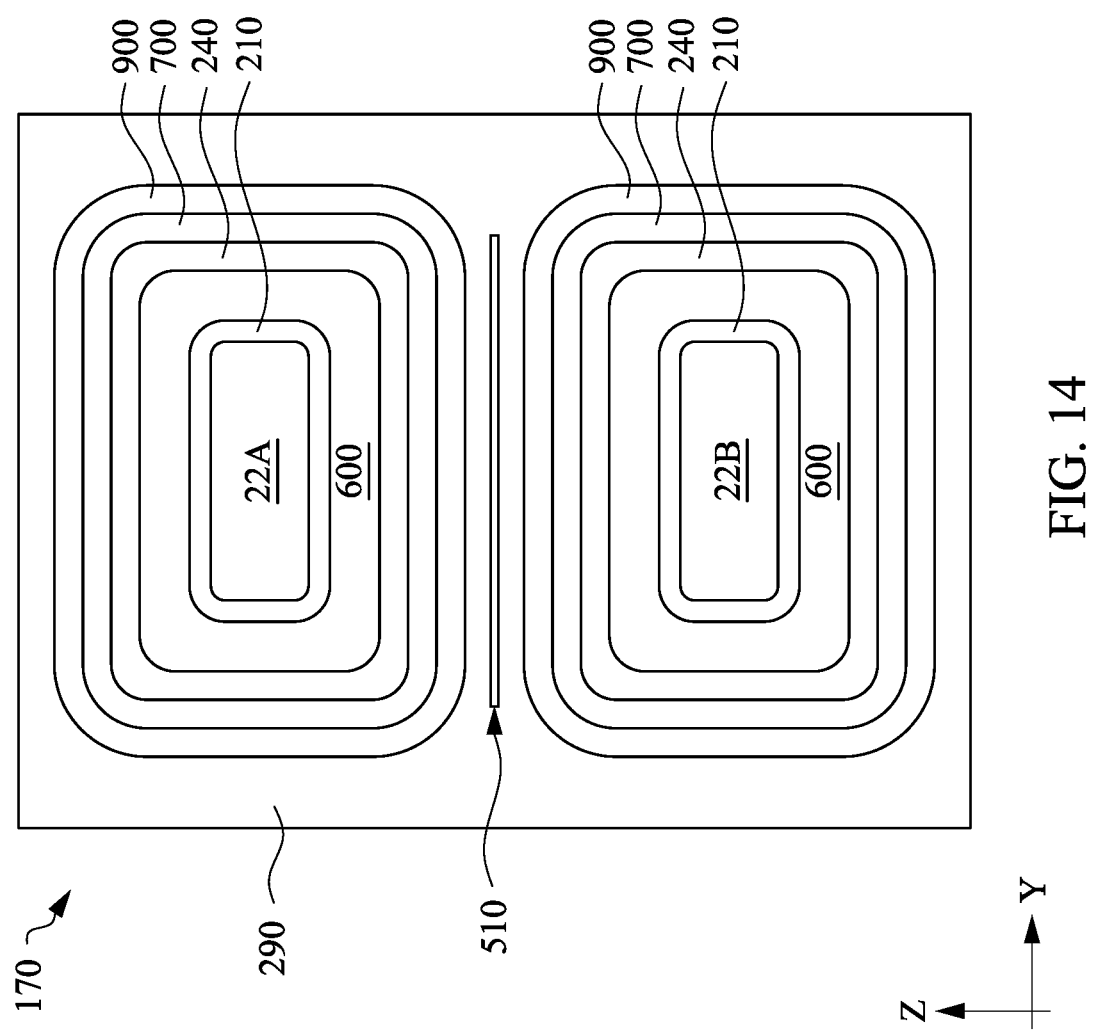
Figure 15:
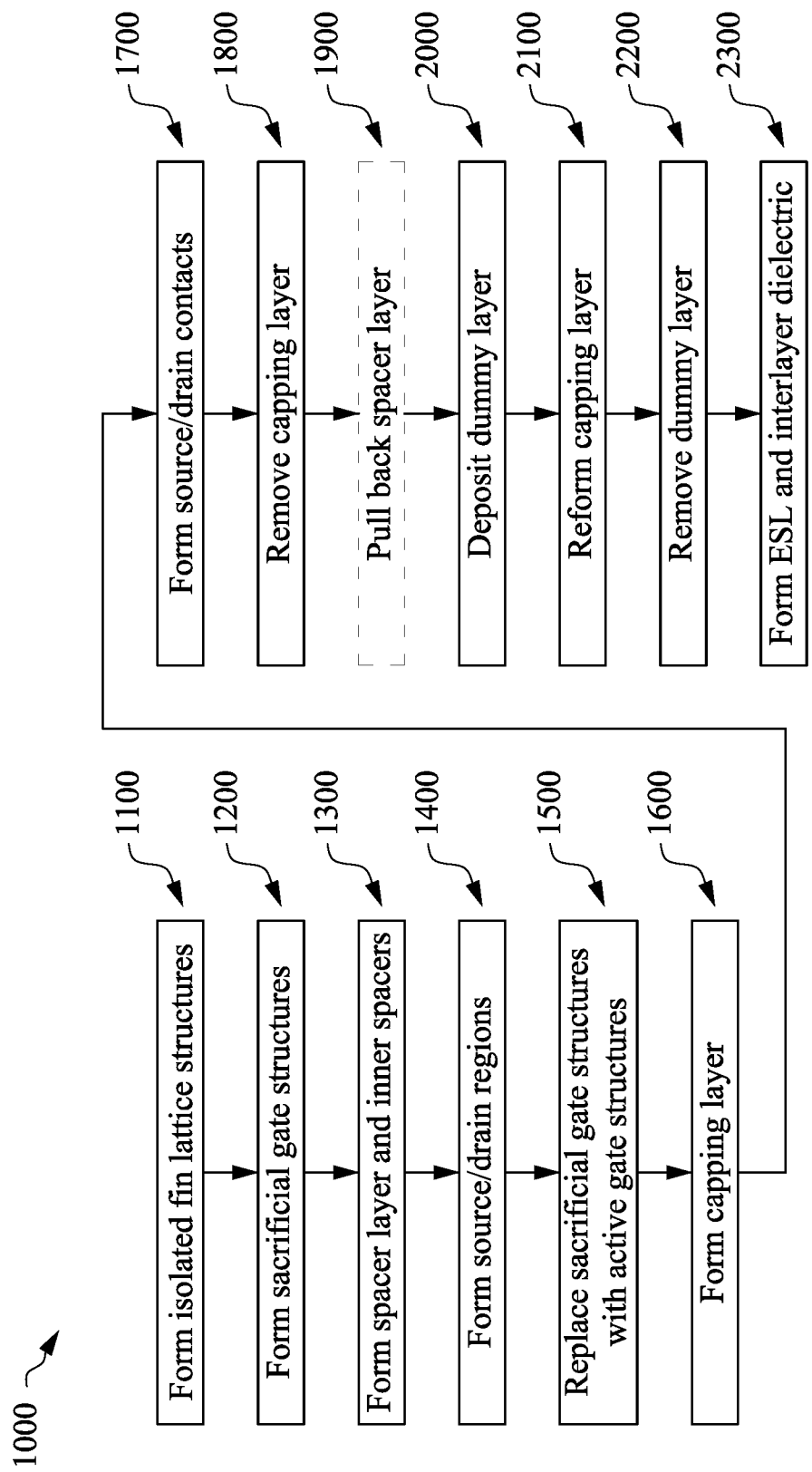
FIG. 15 is a flowchart illustrating a method of fabricating a semiconductor device according to various aspects of the present disclosure.

FIG. 15 illustrates a flowchart of a method 1000 for forming an IC device or a portion thereof from a workpiece, according to one or more aspects of the present disclosure. Method 1000 is merely an example and are not intended to limit the present disclosure to what is explicitly illustrated in method 1000. Additional acts can be provided before, during and after the method 1000 and some acts described can be replaced, eliminated, or moved around for additional embodiments of the method. Not all acts are described herein in detail for reasons of simplicity. Method 1000 is described below in conjunction with fragmentary perspective and/or cross-sectional views of a workpiece, shown in FIGS. 2A-14, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2A through 14 are perspective views and cross-sectional views of intermediate stages in the manufacturing of FETs, such as nanosheet FETs, in accordance with some embodiments. FIGS. 2A, 3A, 4A, 5A, 6A, 7A, 8A, 9A and 10A illustrate perspective views. FIGS. 2B, 3B, 4B, 5B, 6B, 7B, 8B, 9B, 10B and 14 illustrate side views taken along reference cross-section B-B' (gate cut) shown in FIGS. 2A, 3A, 4A, 5A and 6A. FIGS. 4C, 5C, 6C, 6D, 7C, 8C, 9C, 10C, 11A, 11B, 12A-12I and 13A-13H illustrate side views taken along reference cross-section C-C' (channel/fin cut) illustrated in FIG. 4A.

Figure 2B:
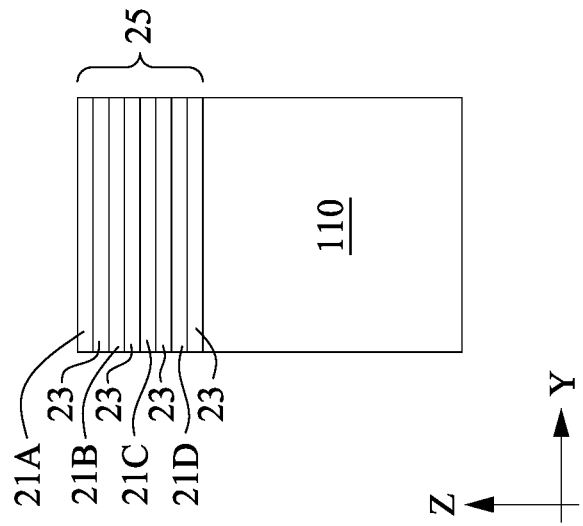
FIGS. 2A-14 are views of various embodiments of an IC device of at various stages of fabrication according to various aspects of the present disclosure.
Figure 2A:
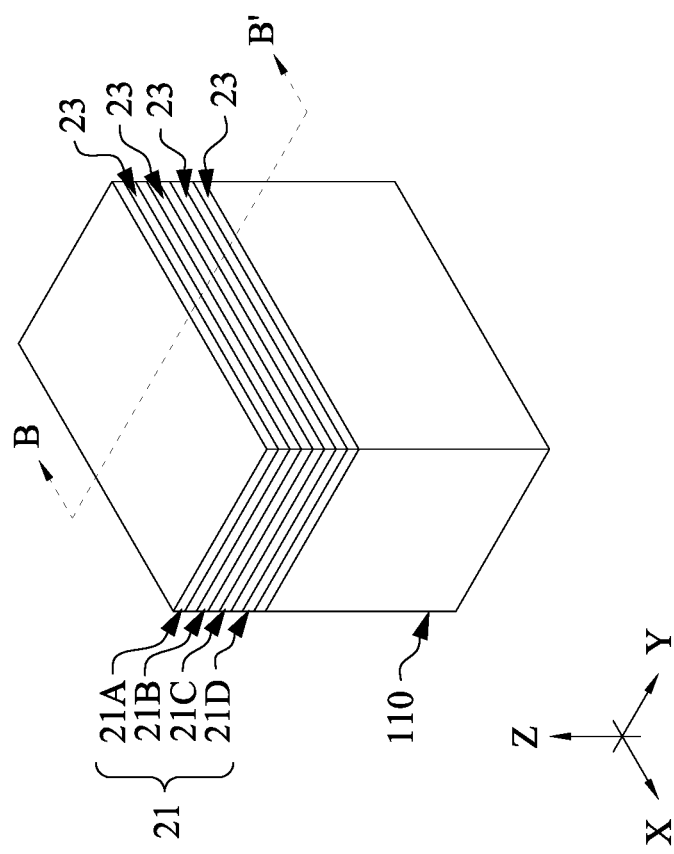

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

In FIG. 3A and FIG. 3B, fins 32 are formed in the substrate 110 and nanostructures 22, 24 are formed in the multi-layer stack 25 corresponding to act 1100 of FIG. 15. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A-22D (also referred to as "channels" below) are formed from the first semiconductor layers 21, and second nanostructures 24 are formed from the second semiconductor layers 23. Distance CD1 between adjacent fins 32 and nanostructures 22, 24 may be from about 18 nm to about 100 nm. A portion of the device 10 is illustrated in FIGS. 3A and 3B including two fins 32 for simplicity of illustration. The process 1000 illustrated in FIGS. 2A-14 may be extended to any number of fins, and is not limited to the two fins 32 shown in FIGS. 3A-14.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 3A and 3B illustrate the fins 32 having tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 3A and 3B, isolation regions 36, which may be shallow trench isolation (STI) regions, are formed adjacent the fins 32. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a fill material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2A through 3B illustrate one embodiment (e.g., etch last) of forming the fins 32 and the nanostructures 22, 24. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 3A and FIG. 3B, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

Figure 4A:
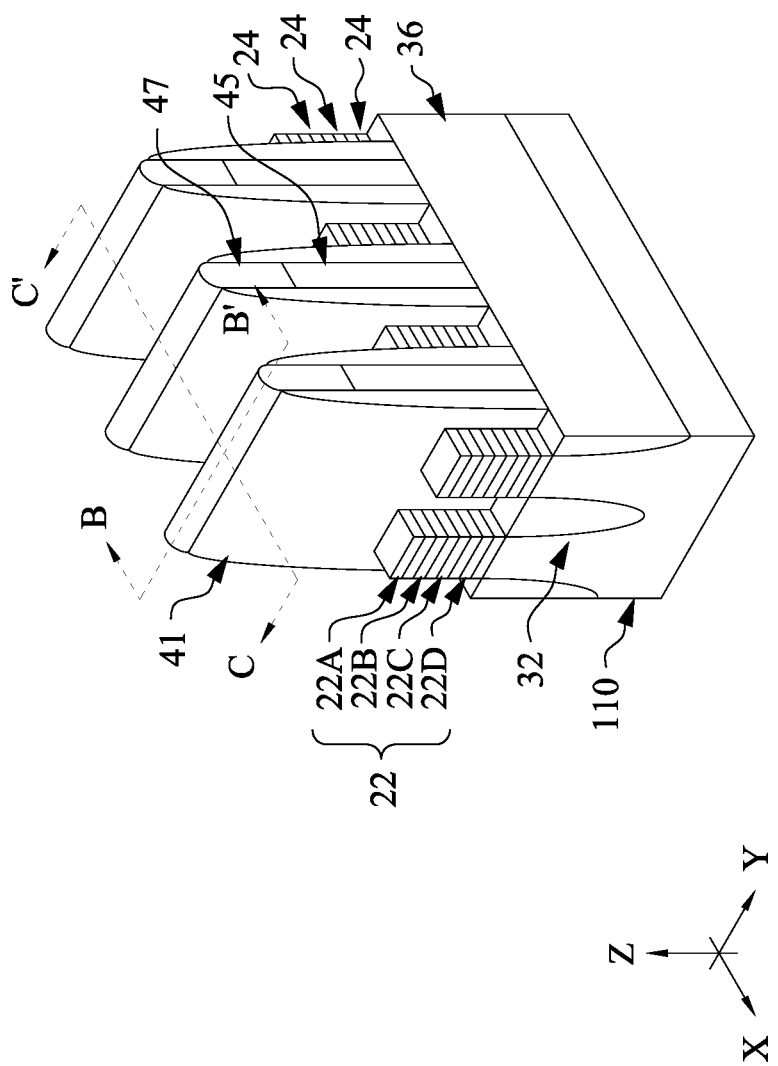
Figure 4C:
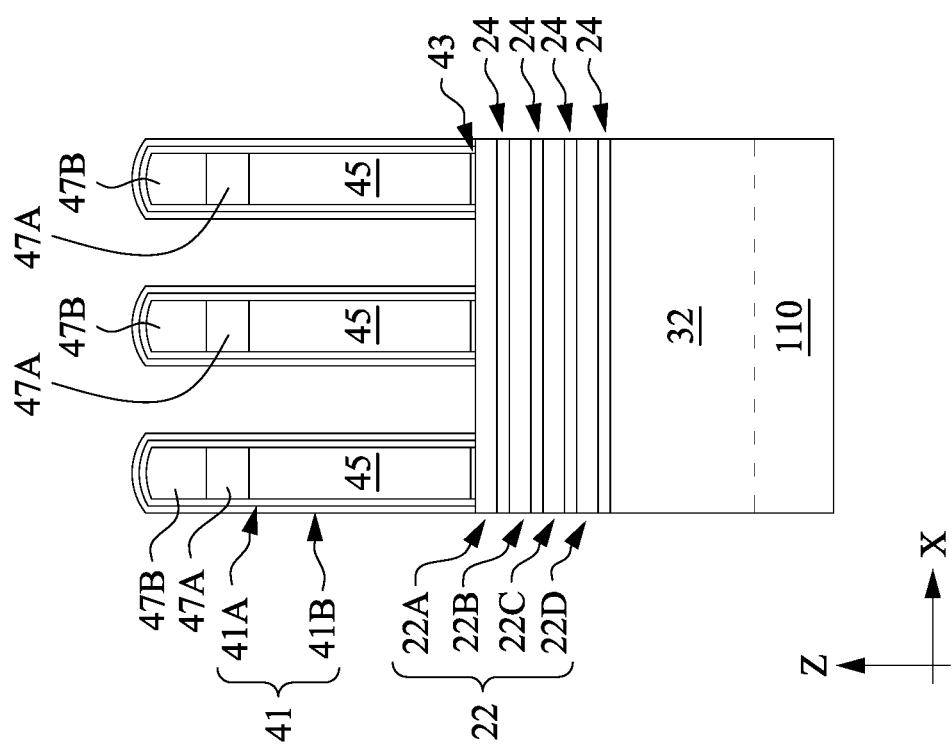
Figure 4B:
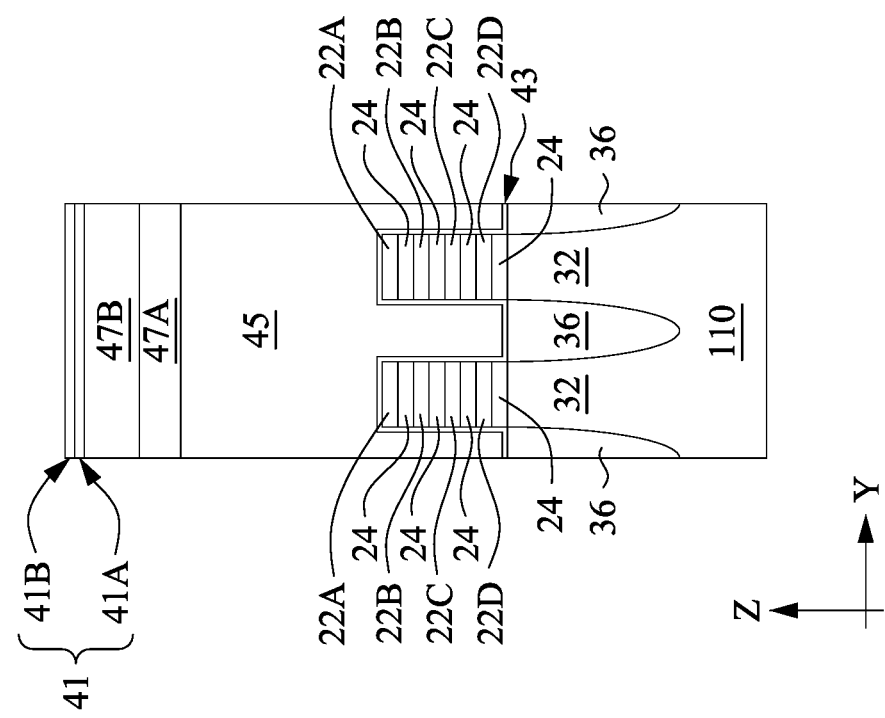

In FIGS. 4A-4C, dummy gate structures 40 are formed over the fins 32 and/or the nanostructures 22, 24, corresponding to act 1200 of FIG. 15. A dummy gate layer 45 is formed over the fins 32 and/or the nanostructures 22, 24. The dummy gate layer 45 may be made of materials that have a high etching selectivity versus the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer 43 is formed before the dummy gate layer 45 between the dummy gate layer 45 and the fins 32 and/or the nanostructures 22, 24. In some embodiments, the mask layer 47 includes a first mask layer 47A in contact with the dummy gate layer 45, and a second mask layer 47B overlying the first mask layer 47A. The first mask layer 47A may be or include the same or different material as that of the second mask layer 47B.

A spacer layer 41 is formed over sidewalls of the mask layer 47 and the dummy gate layer 45, corresponding to act 1300 of FIG. 15. The spacer layer 41 is made of an insulating material, such as silicon nitride, silicon oxide, silicon carbonitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments. In some embodiments, as shown in detail in FIGS. 4B, 4C, the spacer layer 41 includes a first spacer layer 41A in contact with the nanostructure 22A, the gate dielectric layer 43, the dummy gate layer 45 and the first and second mask layers 47A, 47B. A second spacer layer 41B of the spacer layer 41 may be in contact with the first spacer layer 41A and the nanostructure 22A. The first spacer layer 41A may be or include the same or different material as that of the second spacer layer 41B.

FIGS. 4A-4C illustrate one process for forming the spacer layer 41. In some embodiments, the spacer layer 41 is formed alternately or additionally after removal of the dummy gate layer 45. In such embodiments, the dummy gate layer 45 is removed, leaving an opening, and the spacer layer 41 may be formed by conformally coating material of the spacer layer 41 along sidewalls of the opening, such as on the ILD 130 (see FIG. 9A). The conformally coated material may then be removed from the bottom of the opening corresponding to the top surface of the uppermost channel, e.g., the channel 22A, prior to forming an active gate, such as the gate structure 200.

While not specifically illustrated in FIGS. 4A-4C, in some embodiments, the hybrid fins 94 are formed following formation of the isolation regions 36 and prior to formation of the dummy gate structures 40. The hybrid fins 94 may be formed in a self-aligned process by first depositing the liner layer 93 to cover the stacks of nanostructures 22, 24 shown in FIG. 4B, then depositing the fill layer 95 to fill remaining portions of openings between the stacks. Excess materials of the liner layer 93 and the fill layer 95 overlying the nanostructures 22A are then removed, for example, by a planarization process, such as a CMP. If included, the gate isolation structures 99 are then formed over the hybrid fins 94.

Figure 5A:
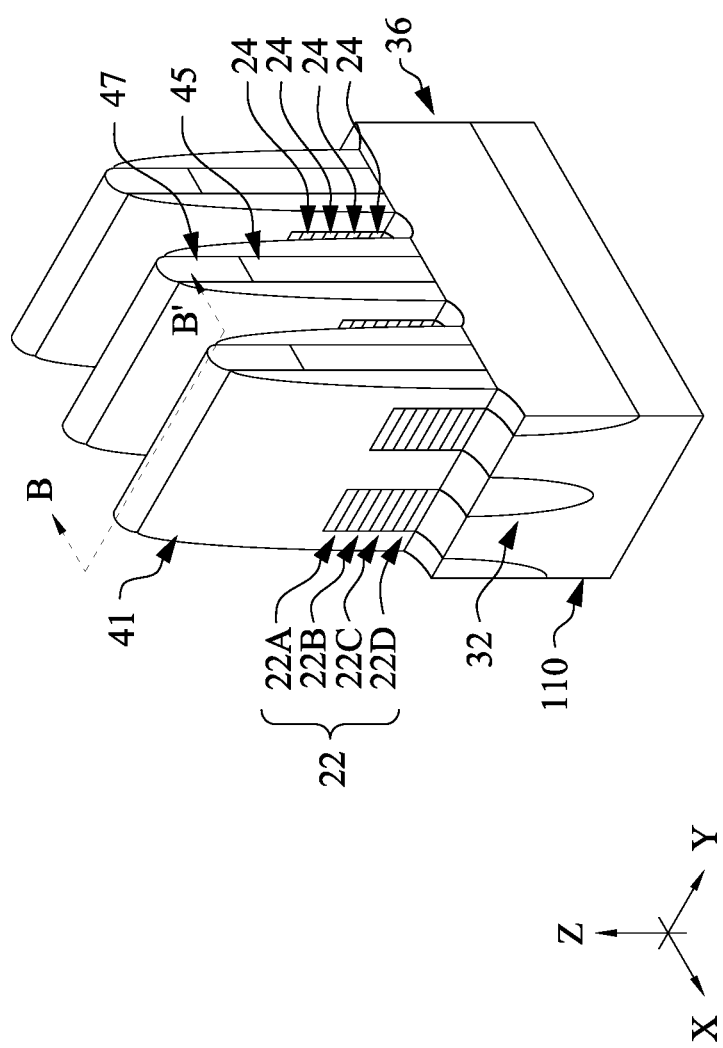
Figure 5C:
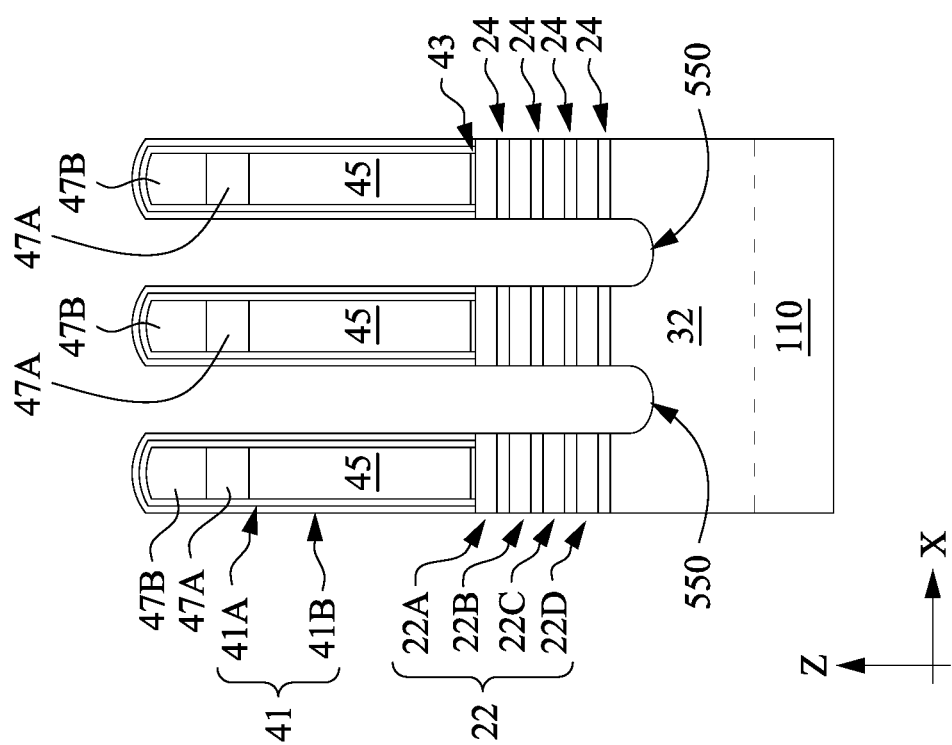
Figure 5B:
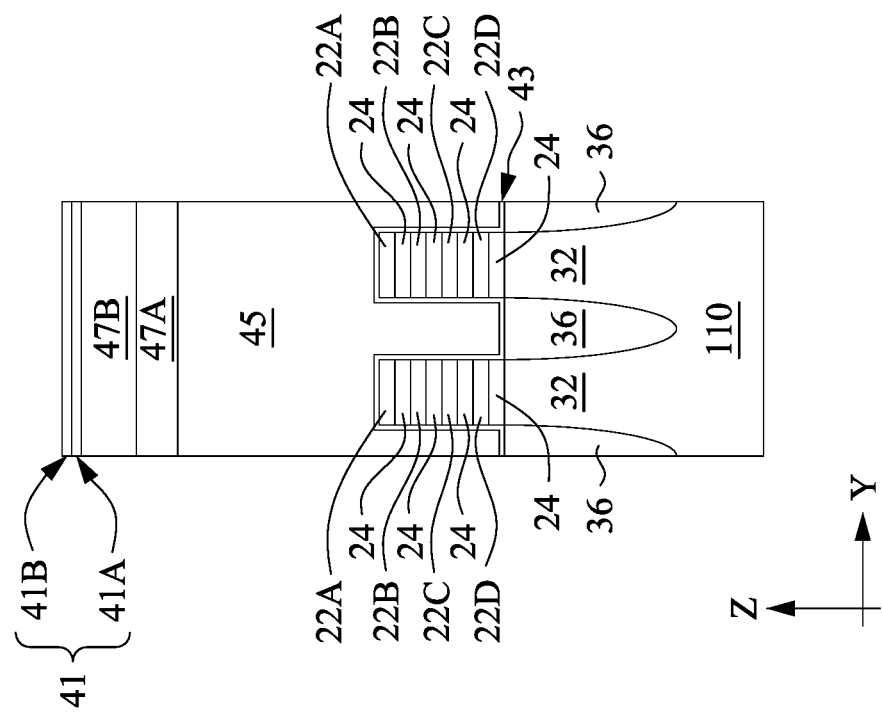

In FIGS. 5A-5C, an etching process is performed to etch the portions of protruding fins 32 and/or nanostructures 22, 24 that are not covered by dummy gate structures 40, resulting in the structure shown. The recessing may be anisotropic, such that the portions of fins 32 directly underlying dummy gate structures 40 and the spacer layer 41 are protected, and are not etched. The top surfaces of the recessed fins 32 may be substantially coplanar with the top surfaces of the isolation regions 36 as shown, in accordance with some embodiments. The top surfaces of the recessed fins 32 may be lower than the top surfaces of the isolation regions 36, in accordance with some other embodiments. FIG. 5C shows three vertical stacks of nanostructures 22, 24 following the etching process for simplicity. In general, the etching process may be used to form any number of vertical stacks of nanostructures 22, 24 over the fins 32. In some embodiments, the second mask layer 47B is exposed following the etching process, for example, due to removal of upper portions of the spacer layers 41A, 41B during the etching process.

Figure 6B:
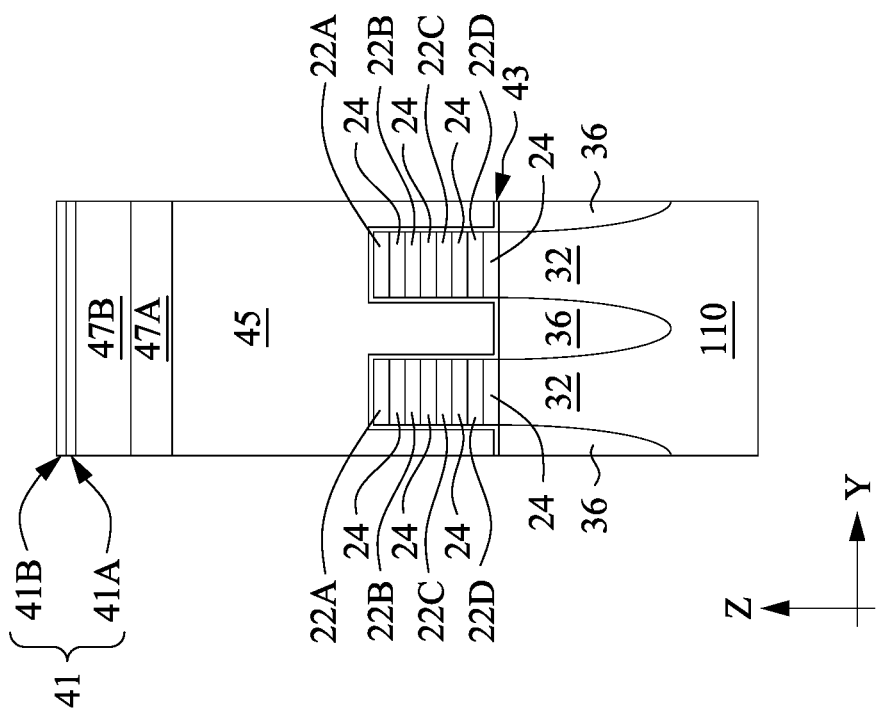
Figure 6A:
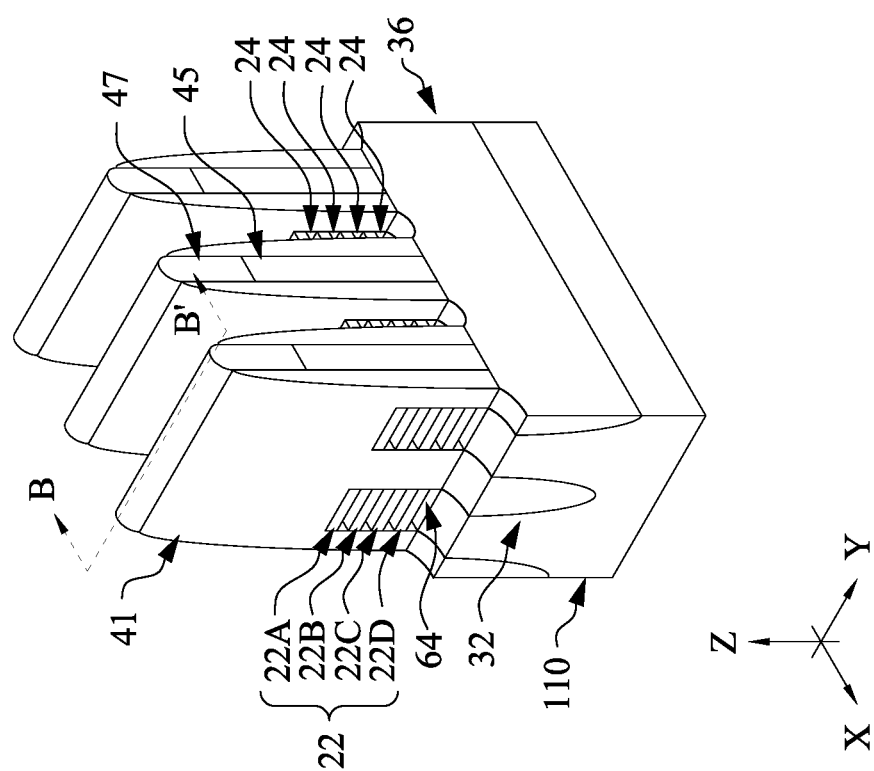
Figure 6C:
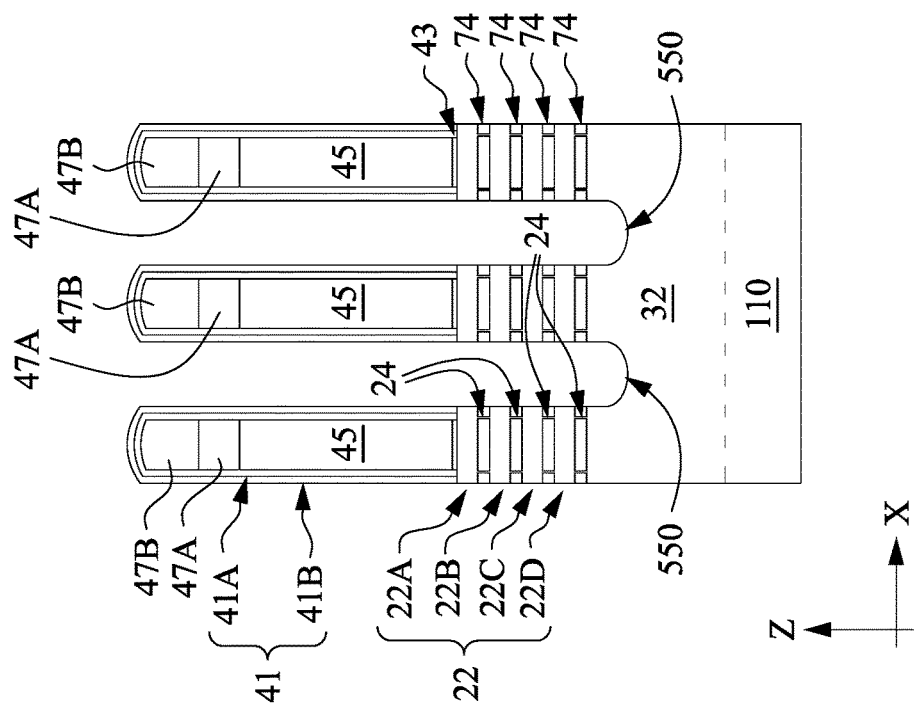

FIGS. 6A-6D illustrate formation of inner spacers 74, corresponding to act 1300 of FIG. 15. A selective etching process is performed to recess end portions of the nanostructures 24 exposed by openings in the spacer layer 41 without substantially attacking the nanostructures 22. After the selective etching process, recesses 64 are formed in the nanostructures 24 at locations where the removed end portions used to be. The resulting structure is shown in FIGS. 6A, 6C.

Figure 6D:
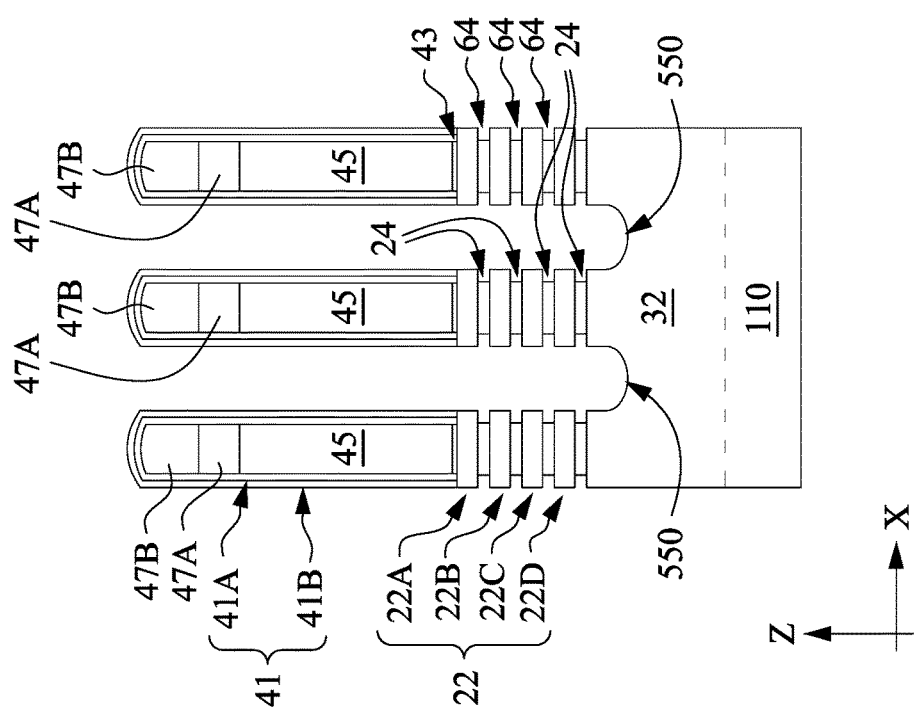
Figure 7A:
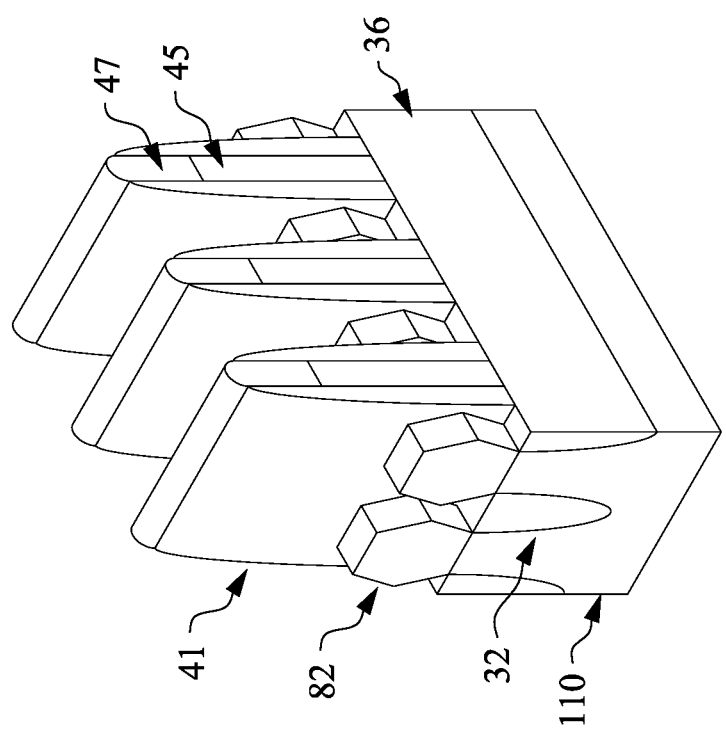
Figure 7C:
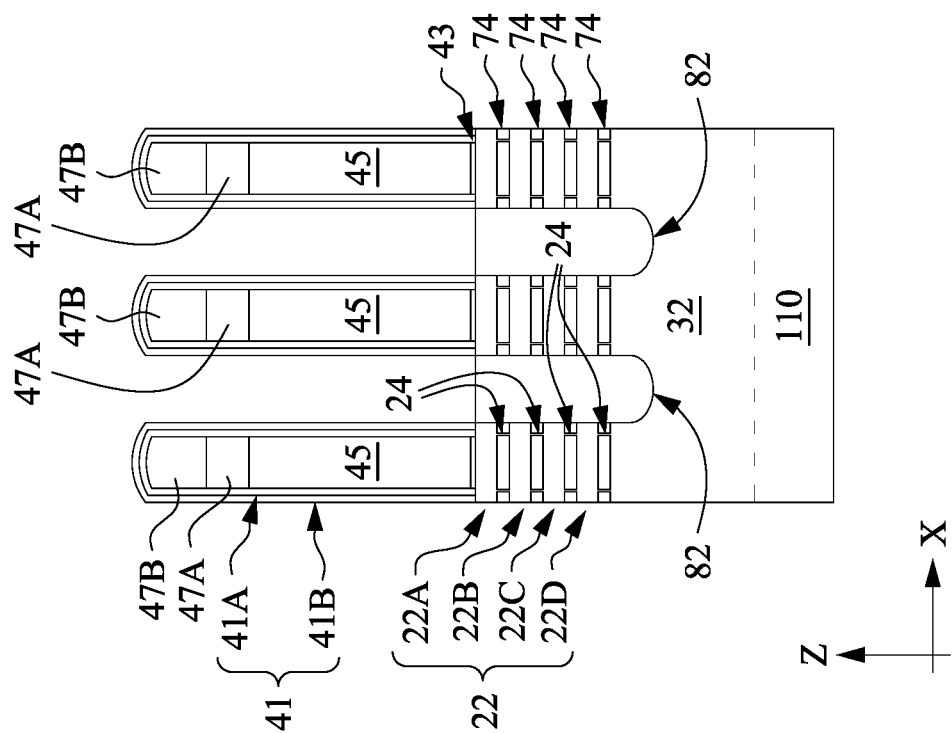
Figure 7B:
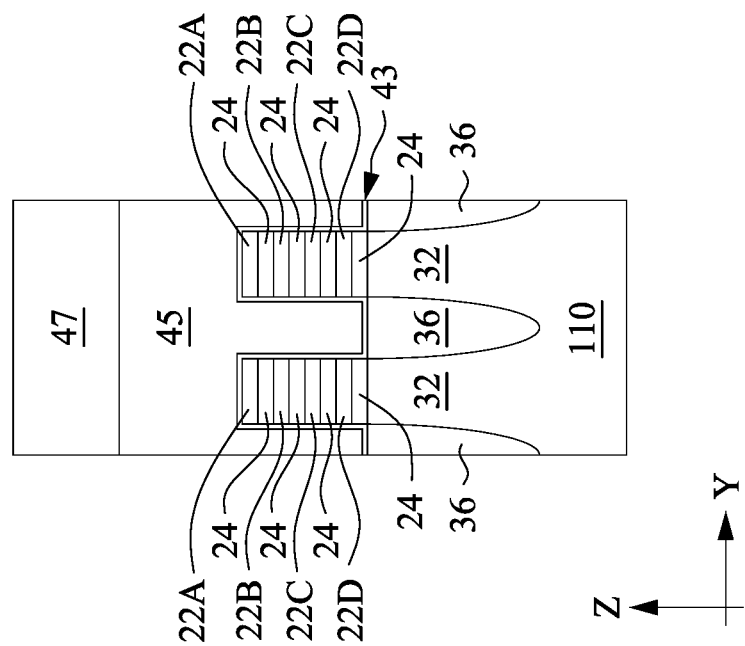

Referring to FIG. 6D, next, an inner spacer layer is formed to fill the recesses 64 in the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses 64, for example, on sidewalls of the nanostructures 22 and the fins 32. The remaining portions of the inner spacer layers (e.g., portions disposed inside the recesses 64 in the nanostructures 24) form the inner spacers 74. The resulting structure is shown in FIG. 6D.

FIGS. 7A-8B illustrate formation of source/drain regions 82. In the illustrated embodiment, the source/drain regions 82 are epitaxially grown from epitaxial material(s). In some embodiments, the source/drain regions 82 exert stress in the respective channels 22A-22D, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

As described with reference to FIGS. 1A-1F, the source/drain regions 82 may be or include SiP, SiAs, SiSb, SiPAs, SiP:As:Sb or the like. In some embodiments, the source/drain regions 82 may be or include SiGe:B, SiGe:B:Ga, SiGe:Sn, SiGe:B:Sn or the like. The source/drain regions 82 may exert a compressive strain in the channel regions. The source/drain regions 82 may have surfaces raised from respective surfaces of the fins and may have facets. Neighboring source/drain regions 82 may merge in some embodiments to form a singular source/drain region 82 adjacent two neighboring fins 32.

Figure 8A:
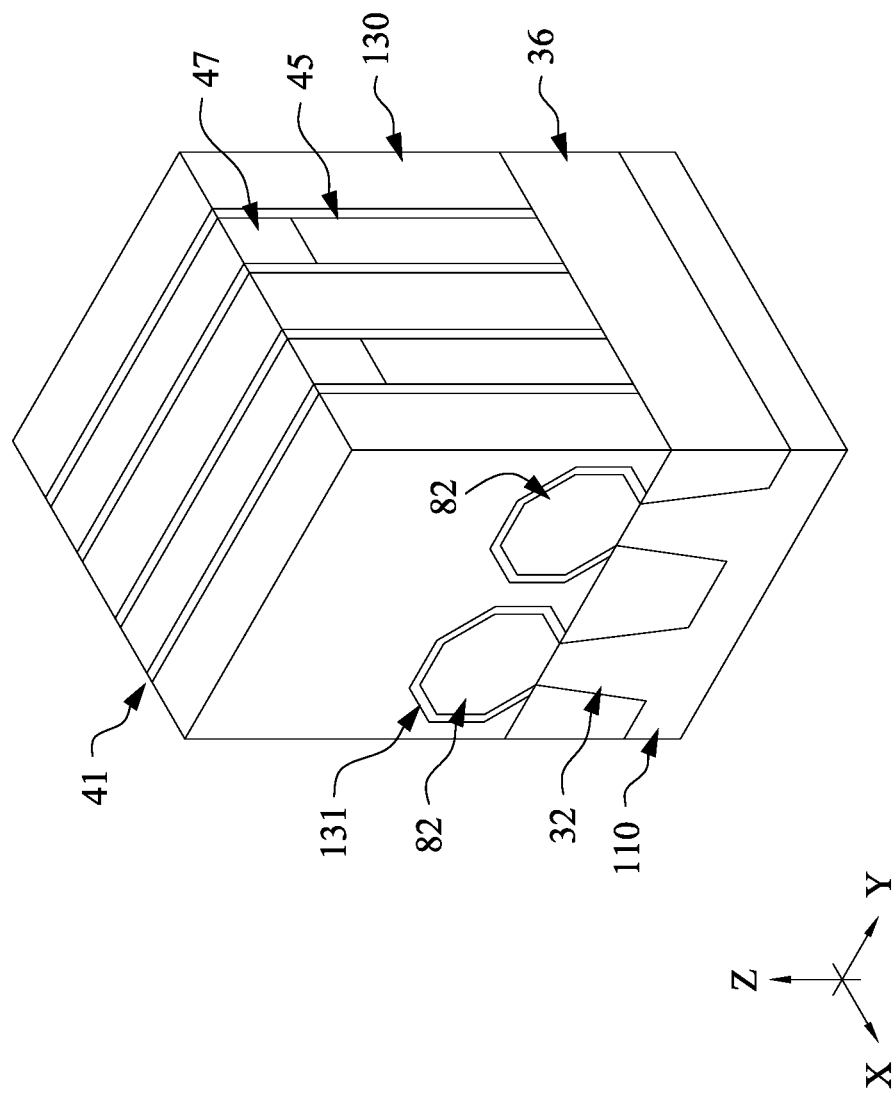
Figure 8C:
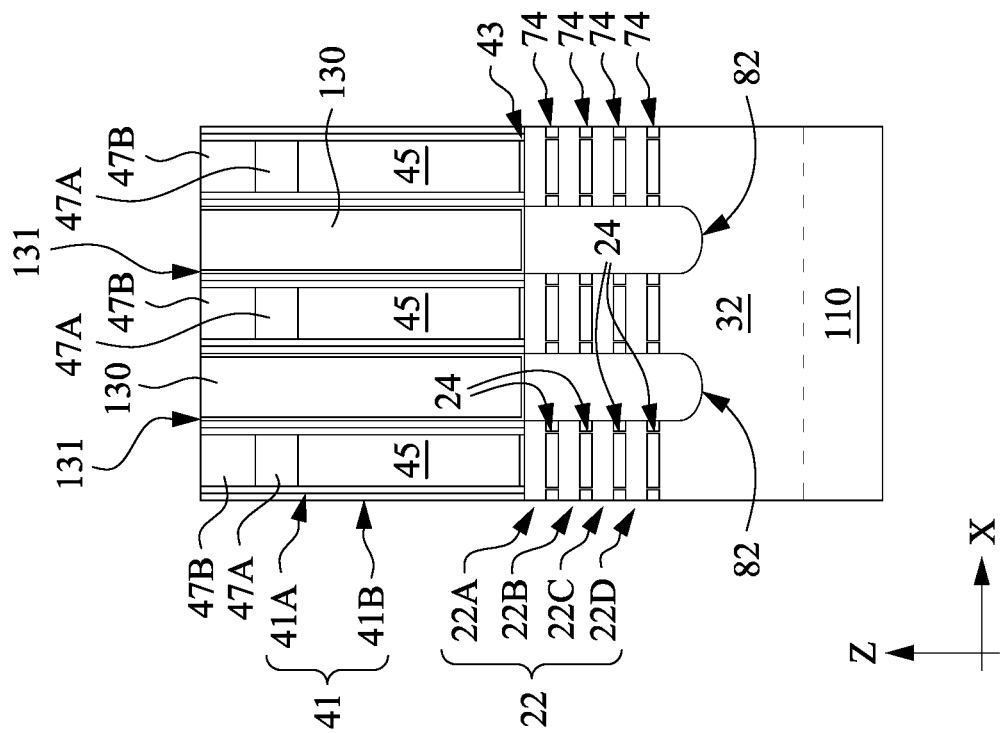
Figure 8B:
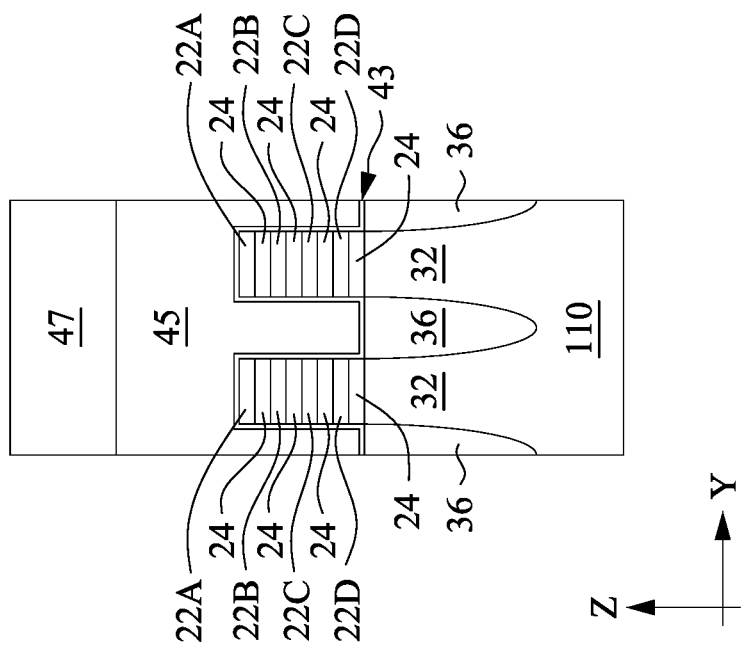
Figure 9A:
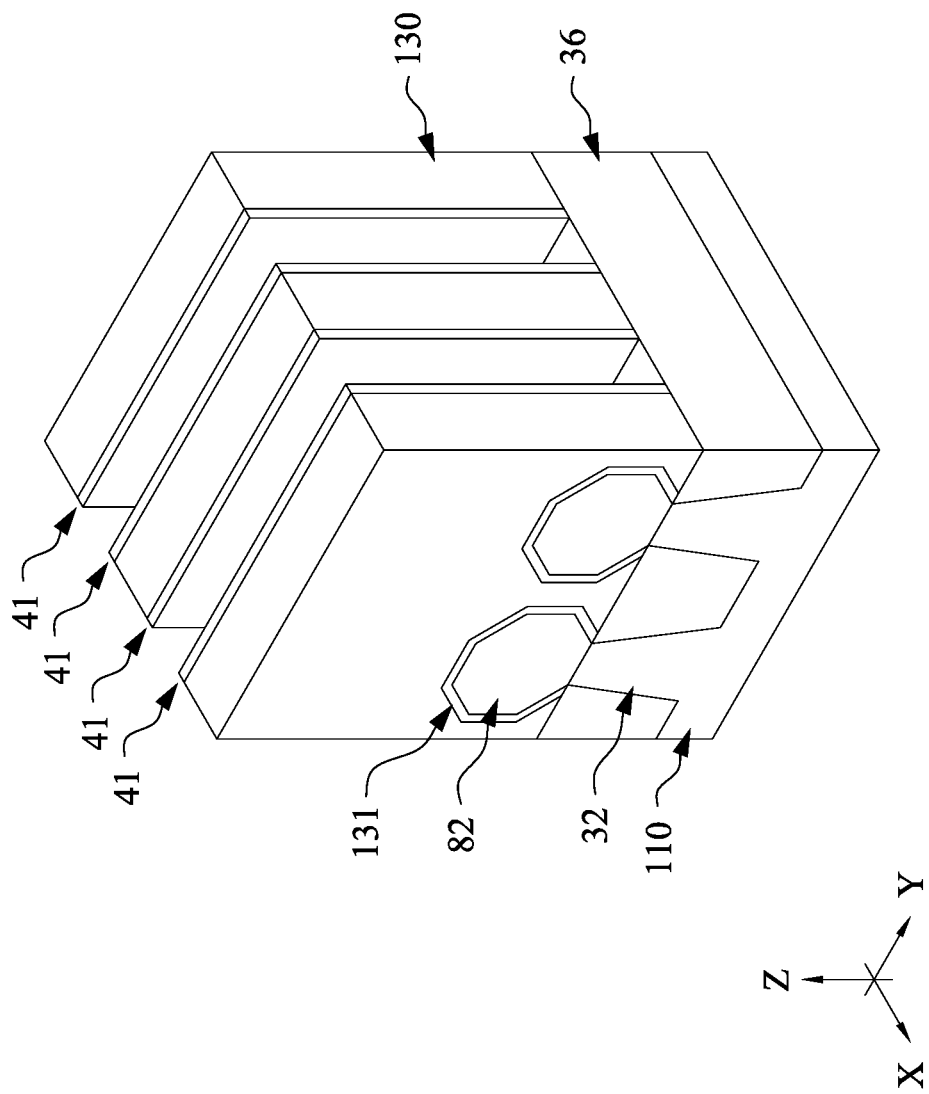
Figure 9C:
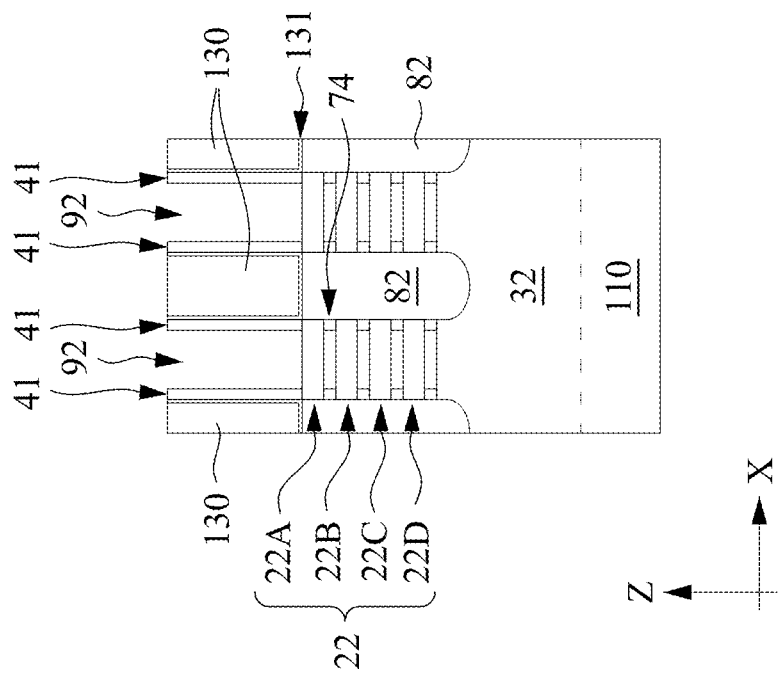
Figure 9B:
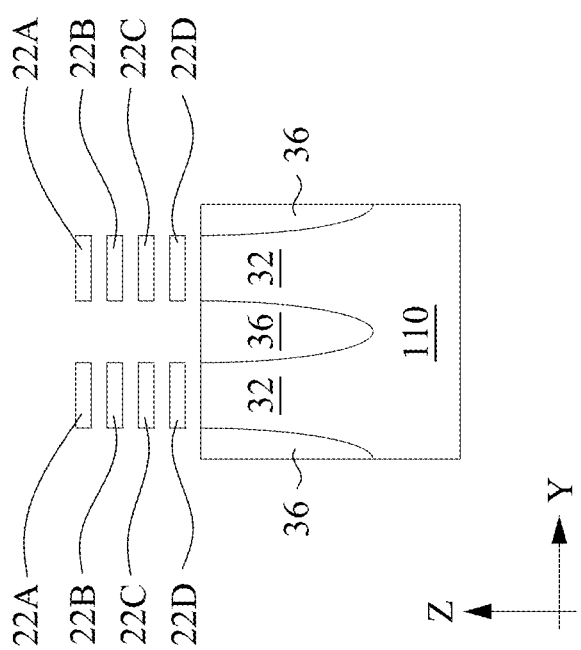

In FIGS. 8A-8C, following formation of the source/drain regions 82, the ILD 130 is formed covering the source/drain regions 82 and abutting the spacer layer 41. In some embodiments, the ESL 131 is formed prior to forming the ILD 130. The ESL 131 may be formed by depositing a conformal thin layer of a dielectric material different from that of the ILD 130, such as one or more of SiN, SiCN, SiC, SiOC, SiOCN, HfO2, ZrO2, ZrAlOx, HfAlOx, HfSiOx, Al2O3, or other suitable material. Following deposition of the ESL 131, the ILD 130 may be deposited by a suitable process, such as a blanket deposition process, including PVD, CVD, ALD, or the like. The material of the ILD 130 may include silicon dioxide or a low-k dielectric material (e.g., a material having a dielectric constant (k-value) lower than the k-value (about 3.9) of silicon dioxide). The low-k dielectric material may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), Spin-On-Glass (SOG) or a combination thereof. The ILD 130 may be deposited by spin-on coating, CVD, Flowable CVD (FCVD), PECVD, PVD, or another deposition process.

FIGS. 9A-9D illustrate formation of active gate structures 200, corresponding to act 1500 of FIG. 15. A planarization process, such as a chemical mechanical polishing (CMP) process, is performed on the ILD 130 and the ESL 131. The hard masks 47A, 47B and portions of the gate spacers 41 are also removed in the planarization process. After the planarization process, the dummy gate layers 45 are exposed. The top surfaces of the ILD 130 and the ESL 131 may be coplanar with the top surfaces of the dummy gate layers 45 and the gate spacers 41.

Next, the dummy gate layer 45 is removed in an etching process, so that recesses 92 are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric 43, when present, may be used as an etch stop layer when the dummy gate layer 45 is etched. The dummy gate dielectric 43 may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of NFETs, and nanostructures 22 may be removed and the nanostructures 24 may be patterned to form channel regions of PFETs. In some embodiments, the nanostructures 22 may be removed and the nanostructures 24 may be patterned to form channel regions of NFETs, and the nanostructures 24 may be removed and the nanostructures 22 may be patterned to form channel regions of PFETs. In some embodiments, the nanostructures 22 may be removed and the nanostructures 24 may be patterned to form channel regions of both PFETs and NFETs.

In some embodiments, the nanosheets 22 are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction (see FIG. 10C, for example).

Figure 10A:
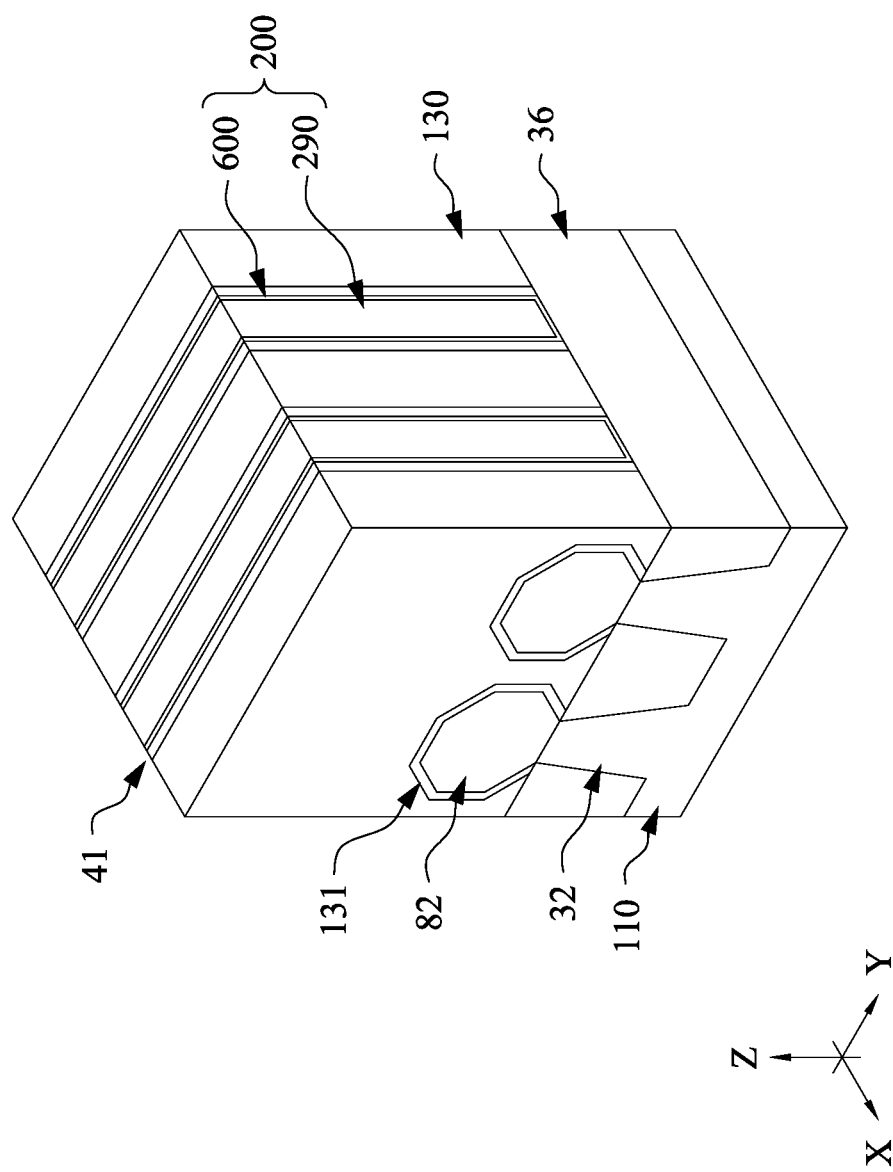
Figure 10C:
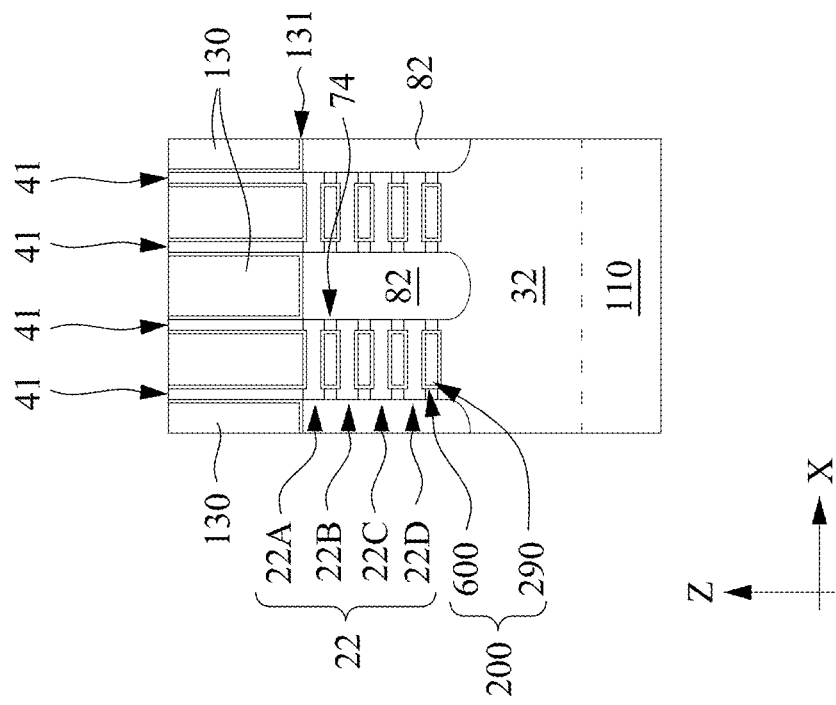
Figure 10B:
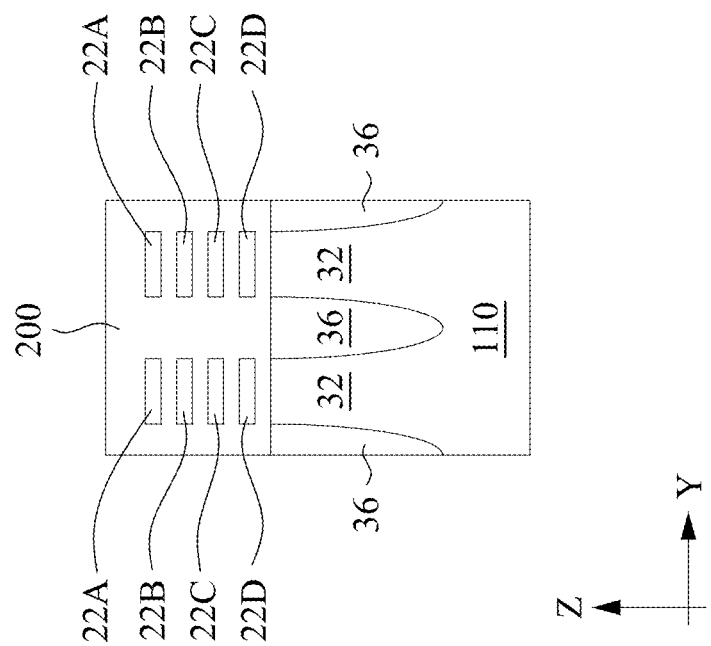

In FIGS. 10A-10C, replacement gates 200 are then formed. The gate structures 200 may be formed by a series of deposition operations, such as ALD cycles, that deposit the various layers of the gate structure 200 in the openings 92, described below with reference to FIG. 14.

FIG. 14 is a detailed view of a portion of the gate structure 200. The gate structure 200 generally includes the interfacial layer (IL, or "first IL" below) 210, at least one gate dielectric layer 600, the work function metal layer 900, and the gate fill layer 290. In some embodiments, each replacement gate 200 further includes at least one of a second interfacial layer 240 or a second work function layer 700.

With reference to FIG. 14, in some embodiments, the first IL 210 includes an oxide of the semiconductor material of the substrate 110, e.g. silicon oxide. In other embodiments, the first IL 210 may include another suitable type of dielectric material. The first IL 210 has a thickness in a range between about 5 angstroms and about 50 angstroms.

Still referring to FIG. 14, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses HfCl4 and/or H2O as precursors. Such an ALD process may form the first gate dielectric layer 220 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the GAA devices 20A-20E.

With further reference to FIG. 14, the second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfTiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of $WCl_5$, followed by an Ar purge, followed by a second pulse of $O_2$, followed by another Ar purge. The high-k capping layer is removed to increase gate fill window for further multiple threshold voltage tuning by metal gate patterning.

Further in FIG. 14, after forming the second IL 240 and removing the high-k capping layer, the work function barrier layer 700 is optionally formed on the gate structure 200, in accordance with some embodiments. The work function barrier layer 700 is or comprises a metal nitride, such as TiN, WN, MoN, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 14 further illustrates the metal fill layer 290. In some embodiments, a glue layer (not separately illustrated) is formed between the oxygen blocking layer of the work function metal layer and the metal fill layer 290. The glue layer may promote and/or enhance the adhesion between the metal fill layer 290 and the work function metal layer 900. In some embodiments, the glue layer may be formed of a metal nitride, such as TiN, TaN, MoN, WN, or another suitable material, using ALD. In some embodiments, thickness of the glue layer is between about 10 A and about 25 A. The metal fill layer 290 may be formed on the glue layer, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. In some embodiments, a seam 510, which may be an air gap, is formed in the metal fill layer 290 vertically between the channels 22A, 22B. In some embodiments, the metal fill layer 290 is conformally deposited on the work function metal layer 900. The seam 510 may form due to sidewall deposited film merging during the conformal deposition. In some embodiments, the seam 510 is not present between the neighboring channels 22A, 22B.

Figure 11A:
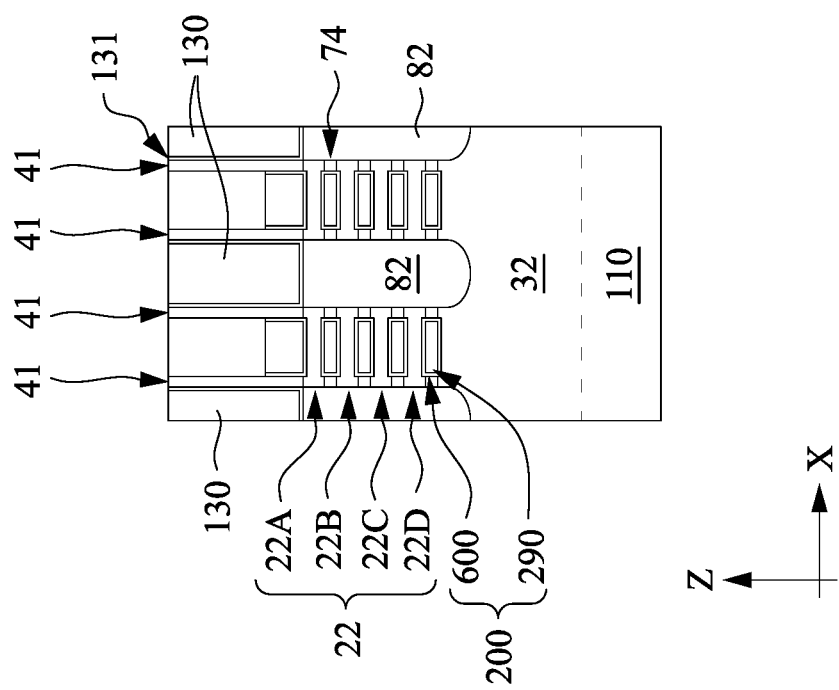

In FIGS. 11A, 11B, following formation of the gate structures 200, an optional first capping layer 204 and a second capping layer 295 are formed overlying the gate dielectric layer 600 and the gate fill layer 290. The first capping layer 204 protects the gate structure 200. Prior to forming the capping layers 204, 295, the gate structures 200 may be recessed by, for example, a suitable etching operation (e.g., ALE), as shown in FIG. 11A.

As illustrated in FIG. 11B, in some embodiments, the first capping layer 204 is formed by depositing a dielectric material, such as SiO2, SiN, SiCN, SiOCN, a high-k dielectric material (e.g., Al2O3), or the like, by a suitable deposition process, such as PVD, CVD, ALD, or the like. The first capping layer 204 may prevent current leakage following one or more etching operations, which may be performed to form gate contacts, source/drain contacts 120, isolation structures (e.g., source/drain contact isolation structures), or the like. In some embodiments, the first capping layer 204 is or comprises a dielectric material that is harder than, for example, the second capping layer 295, such as aluminum oxide, or other suitable dielectric material. The first capping layer 204 is not shown in subsequent figures for simplicity of illustration.

The second capping layer 295, also referred to as a "self-aligned capping" (SAC) layer, may provide protection to the underlying gate structure 200, and may also act as a CMP stop layer when planarizing the source/drain contacts 120 following formation thereof. The second capping layer 295 may be formed by depositing a dielectric layer including a dielectric material, such as SiO2, SiN, SiCN, SiC, SiOC, SiOCN, HfO2, ZrO2, ZrAlOx, HfAlOx, HfSiOx, Al2O3, BN, or other suitable dielectric material, by a suitable deposition process, such as PVD, CVD, ALD, or the like. In some embodiments, over longer gate structures and channels, the second capping layer 295 may be split by a support structure. In some embodiments, width (X direction) of the second capping layer 295 is in a range of about 8 nm to about 40 nm.

In FIGS. 12A-12I, the air spacer 131A is formed, corresponding to acts 1700-2300 of FIG. 15. In FIG. 12A, following formation of the second capping layer 295, one or more removal operations, such as an atomic layer etch (ALE), are performed to remove portions of the ILD 130 and the ESL 131 overlying the source/drain regions 82. Following the removal operations, upper surfaces of the source/drain regions 82 are exposed. In some embodiments, upper regions of the source/drain regions 82 are recessed slightly in the removal operations, such that the upper surfaces are convex, as shown in FIG. 12A.

In FIG. 12B, silicide regions 118 and the source/drain contacts 120 are formed on the source/drain regions 82, corresponding to act 1700 of FIG. 15. In some embodiments, P-type source/drain regions 82 are implanted with dopants, which may be optionally followed by an anneal. The dopants may include P-type implants, such as Ga, B, C, Sn or the like, implanted to a depth in a range of about 3 nm to about 10 nm, at a concentration in a range of about $10^{18}$ cm$^{-3}$ to about $10^{21}$ cm$^{-3}$. Implanting the dopants improves activation of the P-type source/drain regions 82.

In some embodiments, the silicide layers 118 are formed prior to formation of the source/drain contacts 120. For example, an N-type or P-type metal layer may be formed as a conformal thin layer over exposed portions of the source/drain regions 82. The metal layer may be or include one or more of Ni, Co, Mn, W, Fe, Rh, Pd, Ru, Pt, Ir, Os or the like. In some embodiments, the metal layer is or includes one or more of Ti, Cr, Ta, Mo, Zr, Hf, Sc, Ys, Ho, Tb, Gd, Lu, Dy, Er, Yb or another suitable material. Following formation of the metal layer, the silicide layers 118 may be formed by annealing the device 10 with the metal layer 115 in contact with the source/drain regions 82. Following the anneal, the silicide layers 118 may be or include one or more of NiSi, CoSi, MnSi, Wsi, FeSi, RhSi, PdSi, RuSi, PtSi, IrSi, OsSi, TiSi, CrSi, TaSi, MoSi, ZrSi, HfSi, ScSi, Ysi, HoSi, TbSI, GdSi, LuSi, DySi, ErSi, YbSi or the like. Silicide of the silicide layers 118 may diffuse into regions below the ESL 131, as shown in FIG. 12B. Thickness of the silicide layers 118 may be in a range of about 1 nm to about 10 nm. Below about 1 nm, contact resistance may be too high. Above about 10 nm, the silicide layers 118 may short with the channels 22A. In some embodiments, the P+ implanted region of the P-type source/drain region 82 may not react completely with the metal layer when forming the silicide layers 118. As such, a P+ doped region may remain under the silicide layers 118.

In FIG. 12B, following formation of the silicide layers 118, unreacted portions of the metal layer are removed. Following removal of the metal layer, the source/drain contacts 120 are formed by filling the openings over the source/drain regions 82 with, for example, the liner layer 120L and the fill layer 120L. In some embodiments, the source/drain contacts 120 are formed by depositing a material that is or includes a conductive material such as Co, W, Ru, combinations thereof, or the like. In some embodiments, the source/drain contacts 120 are or include a Co-, W- or Ru-based compound or alloy including one or more elements, such as Zr, Sn, Ag, Cu, Au, Al, Ca, Be, Mg, Rh, Na, Ir, W, Mo, Zn, Ni, K, Co, Cd, Ru, In, Os, Si, Ge, Mn, combinations thereof, or the like. The source/drain contacts 120 land on the silicide layer 118 and are in contact with the ESL 131 and the hybrid fins 94. Description of the device 10 and illustration thereof in many of the figures is given with reference to GAAFETs including vertical stacks of the nanostructures 22. In some embodiments, the silicide layers 118 and the source/drain contacts 120 are formed in and on source/drain regions 82 of FinFET devices.

Further to FIG. 12B, following formation of the source/drain contacts 120 and the silicide layers 118, the second capping layers 295 are removed (corresponding to act 1800 of FIG. 15) in preparation for forming the air spacers 131A in subsequent processes. The second capping layers 295 may be removed by a suitable etching process, such as ALE, using an etchant that removes the second capping layers 295 without substantially attacking the spacer layer 41 or the gate structure 200.

Figure 12D:
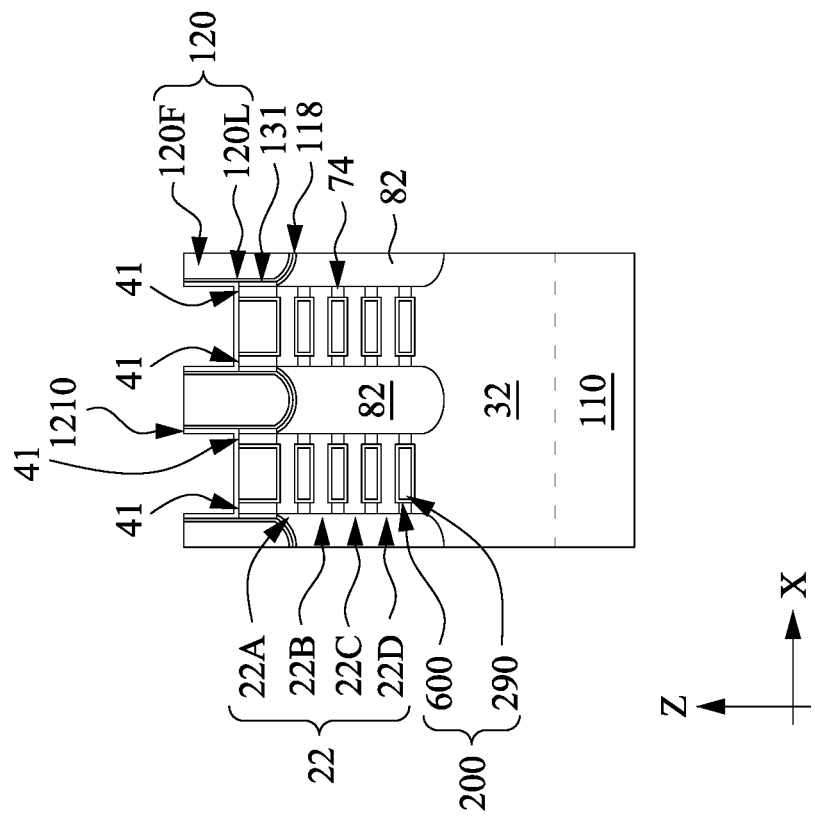
Figure 12C:
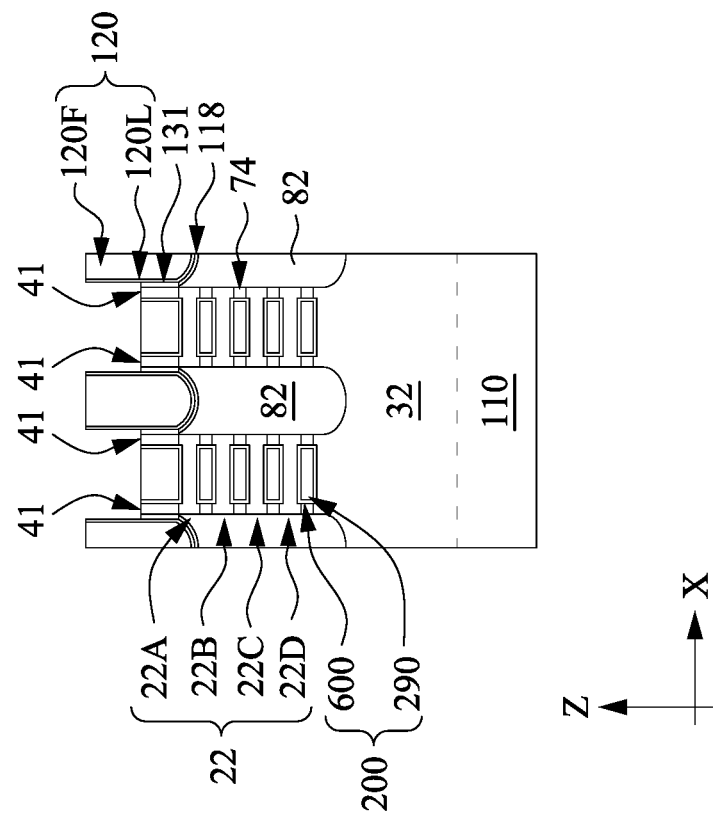

In FIG. 12C, following formation of the silicide layers 118 and the source/drain contacts 120, and removal of the second capping layers 295, the spacer layer 41 and the ESL 131 are recessed to a level substantially coplanar with upper surfaces of the gate structures 200, as shown, corresponding to act 1900 of FIG. 15. In some embodiments, the spacer layer 41 is recessed (or "pulled back") in a first etching operation, such as an ALE, using an etchant that removes the spacer layer 41 without substantially attacking the ESL 131. Following recessing of the spacer layer 41, the ESL 131 is recessed in a second etching operation, such as an ALE, such that heights of the spacer layer 41 and the ESL 131 are substantially the same, and upper surfaces of the gate structure 200, the spacer layer 41 and the ESL 131 are substantially coplanar. In some embodiments, one or more of the spacer layer 41 and the ESL 131 may have an upper surface that is at a level higher than the upper surface of the gate structure 200 following the first and second etching operations. Act 1900 is optional, and embodiments in which act 1900 is omitted are described with reference to FIGS. 13A-13H. In some embodiments, the spacer layer 41 is pulled back, and the ESL 131 is not substantially pulled back, which leads to formation of the structure shown in FIG. 1H.

In FIG. 12D, following recessing of the gate structure 200, the spacer layer 41 and the ESL 131, a dummy liner layer 1210, which may be a removable hard mask liner layer, is formed as a conformal thin layer over exposed surfaces of the gate structure 200, the spacer layer 41, the ESL 131 and the source/drain contact 120, corresponding to act 2000 of FIG. 15. In some embodiments, the dummy liner layer 1210 is or includes one or more of SiN, Si, SiGe, SiOx or the like. In some embodiments, the dummy liner layer 1210 includes a different material than the gate dielectric layer 600 and the spacer layer 41. The dummy liner layer 1210 may be deposited by a suitable deposition process, such as PVD, CVD, ALD or the like. Thickness of the dummy liner layer 1210 may be in a range of about 1 nm to about 10 nm, and may correspond to thickness of the ESL 131. For example, the thickness of the dummy liner layer 1210 may be substantially the same as the thickness of the ESL 131. In some embodiments, the dummy liner layer 1210 is slightly thicker or slightly thinner than the ESL 131. In embodiments in which the ESL 131 is not substantially pulled back, the dummy liner layer 1210 may be formed on sidewalls of the ESL 131.

Figure 12F:
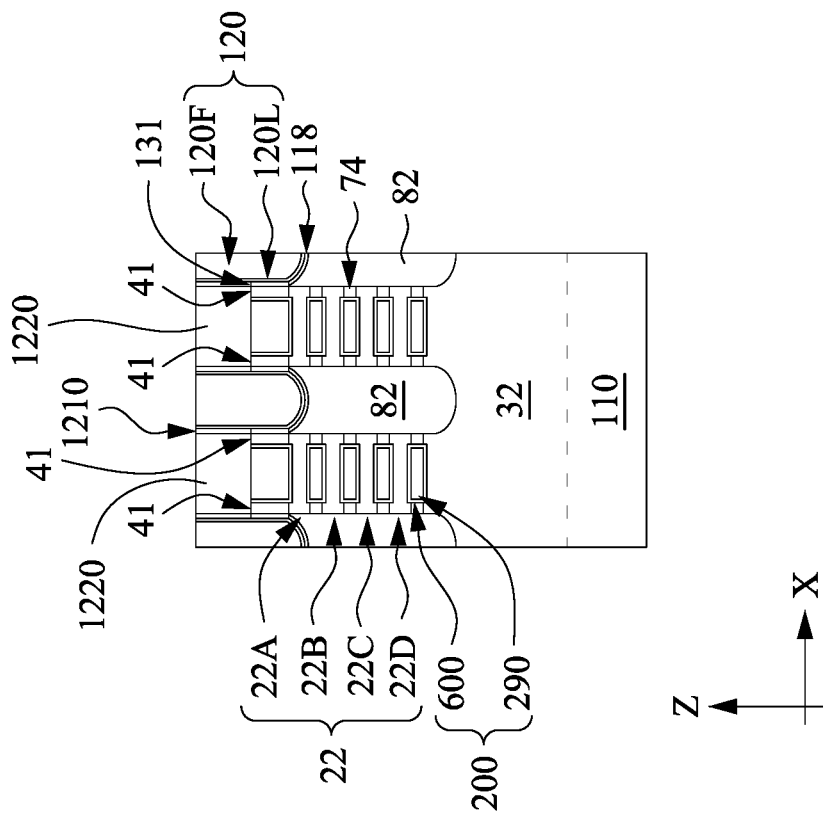
Figure 12E:
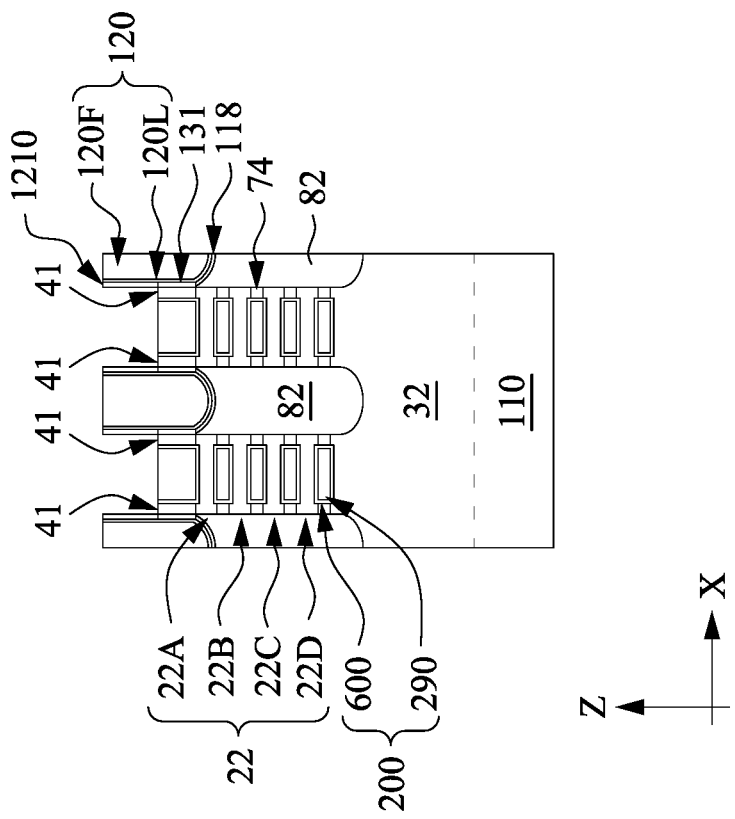

In FIG. 12E, following formation of the dummy liner layer 1210, horizontal portions of the dummy liner layer 1210 overlying the spacer layer 41 and the gate electrode 200 are removed. The removal may be by an appropriate etching process, such as an anisotropic etching process, which may be or include an ALE. Following removal of the horizontal portions of the dummy liner layer 1210, upper surfaces of the gate structure 200 and the spacer layer 41 are exposed.

In FIG. 12F, following exposing the upper surfaces of the gate structure 200 and the spacer layer 41 by removing the horizontal portions of the dummy liner layer 1210, the second capping layer 1220 is formed on exposed surfaces of, and filling the opening between and over, the dummy liner layer 1210, the gate structure 200 and the spacer layer 41, corresponding to act 2100 of FIG. 15. The second capping layer 1220 may be formed by an appropriate deposition process, such as a PVD, CVD or ALD, or the like. In some embodiments, the second capping layer 1220 is or includes SiN, SiCN, SiCON, SiOx, an extreme low-k dielectric (k<2), another suitable low-k dielectric (e.g., 2<k<3.9) or the like. In some embodiments, the second capping layer 1220 is an oxide of silicon, such as $SiO_2$. The second capping layer 1220 generally includes a different material than the dummy liner layer 1210, such as a material having a different etch selectivity than that of the dummy liner layer 1210. The second capping layer 1220 may be formed of a material having lower dielectric constant than the second capping layer 295, which lowers $C_{MEOL}$. For example, the second capping layer 295 may be a harder material, which has higher dielectric constant, to provide better protection to the gate structure 200 during formation of the source/drain contacts 120. The second capping layer 1220, which replaces the second capping layer 295, is not generally used for protection during formation of nearby metal layers, as the source/drain contacts 120 are already formed. As such, the second capping layer 1220 has greater flexibility in choice of material, and a lower dielectric constant material may be chosen that reduces $C_{MEOL}$.

Figure 12H:
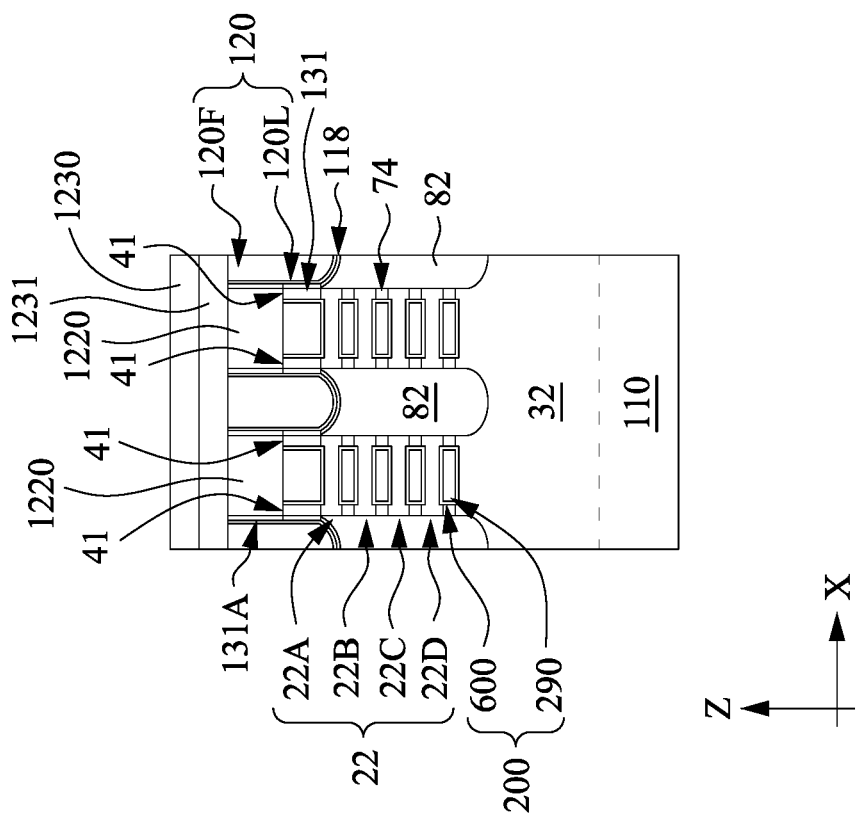
Figure 12G:
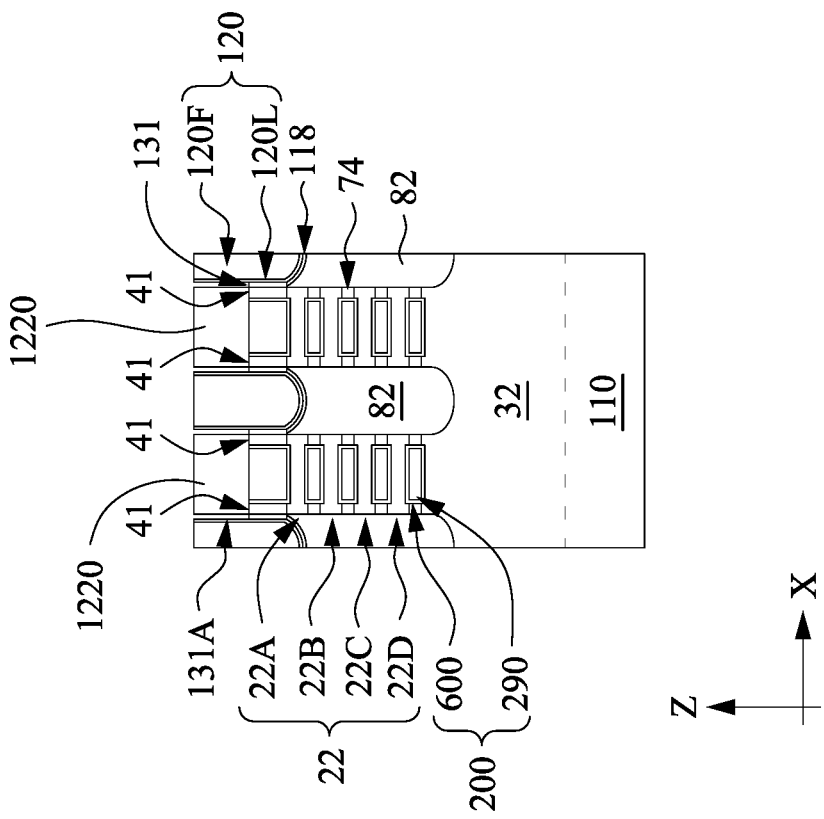

In FIG. 12G, following formation of the second capping layer 1220, the dummy liner layer 1210 is removed, corresponding to act 2200 of FIG. 15. Removal of the dummy liner layer 1210 forms the air spacer 131A is in the second capping layer 1220 and the source/drain contact 120. In some embodiments, the dummy liner layer 1210 is removed by an etching process, such as an ALE. Removal of the dummy liner layer 1210 may stop at an upper surface of the ESL 131. Formation of the air spacer 131A, which may also be considered replacing a portion of the ESL 131 with the air spacer 131A, reduces middle-end-of-line capacitance, as the dielectric constant of the air spacer 131A is lower than that of the ESL 131. In embodiments in which the ESL 131 is not pulled back, the air spacer 41A (see FIG. 1H) may be formed by removing the dummy liner layer 1210.

Figure 12I:
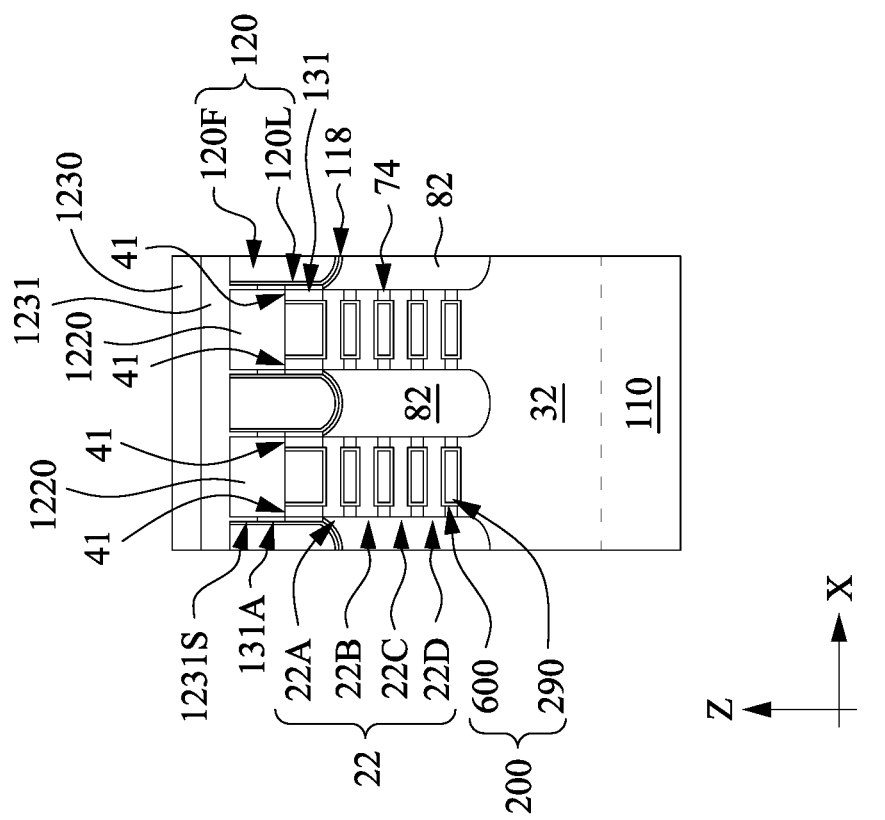

In FIGS. 12H, 12I, the second ESL 1231 and the second ILD 1230 are formed following formation of the air spacer 131A, corresponding to act 2300 of FIG. 15. The second ESL 1231 and the second ILD 1230 may be formed by appropriate deposition processes such as PVD, CVD, ALD or the like. The second ESL 1230 may be formed by depositing a conformal thin layer of a dielectric material different from that of the second ILD 1230, such as one or more of SiN, SiCN, SiC, SiOC, SiOCN, HfO2, ZrO2, ZrAlOx, HfAlOx, HfSiOx, Al2O3, or other suitable material. Following deposition of the second ESL 1231, the second ILD 1230 may be deposited by a suitable process, such as a blanket deposition process, including PVD, CVD, ALD, or the like. The material of the second ILD 1230 may include silicon dioxide or a low-k dielectric material (e.g., a material having a dielectric constant (k-value) lower than the k-value (about 3.9) of silicon dioxide). The low-k dielectric material may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), Spin-On-Glass (SOG) or a combination thereof. The second ILD 1230 may be deposited by spin-on coating, CVD, Flowable CVD (FCVD), PECVD, PVD, or another deposition process. FIG. 12H illustrates an embodiment in which the second ESL 1231 does not significantly extend into the lateral space between the second capping layer 1220 and the source/drain contact 120. FIG. 12I illustrates an embodiment in which the second ESL 1231 extends partially into the lateral space between the second capping layer 1220 and the source/drain contact 120. Extension portions 1231S, which may also be referred to as "seal portions 1231S," of the second ESL 1231 may have width substantially the same as that of the air spacer 131A, and height in a range of about 0 nm (corresponding to FIG. 12H) to about 10 nm. The extension portions 1231S are in contact with sidewalls of the source/drain contacts 120, such as the liner layers 120L, and sidewalls of the second capping layers 1220. Lower surfaces of the extension portions 1231S are separated from the gate structures 200 by the air spacers 295A.

FIGS. 13A-13H illustrate formation of the air spacer 295A according to another embodiment. Many of the operations illustrated in FIGS. 13A-13H are similar to those described with reference to FIGS. 12A-12I.

FIGS. 13A and 13B are substantially the same as FIGS. 12A and 12B. Formation of the source/drain contacts 120, recessing of the gate structure 200 and removal of the second capping layer 295 illustrated in FIGS. 13A, 13B are described above with reference to FIGS. 12A, 12B, and not repeated here.

Figure 13D:
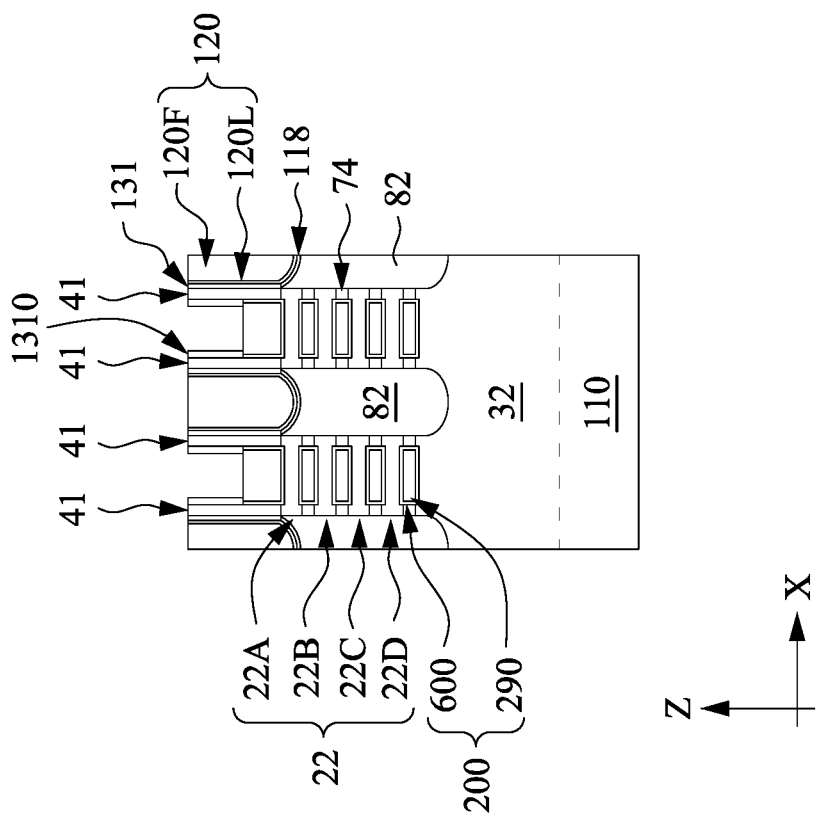
Figure 13C:
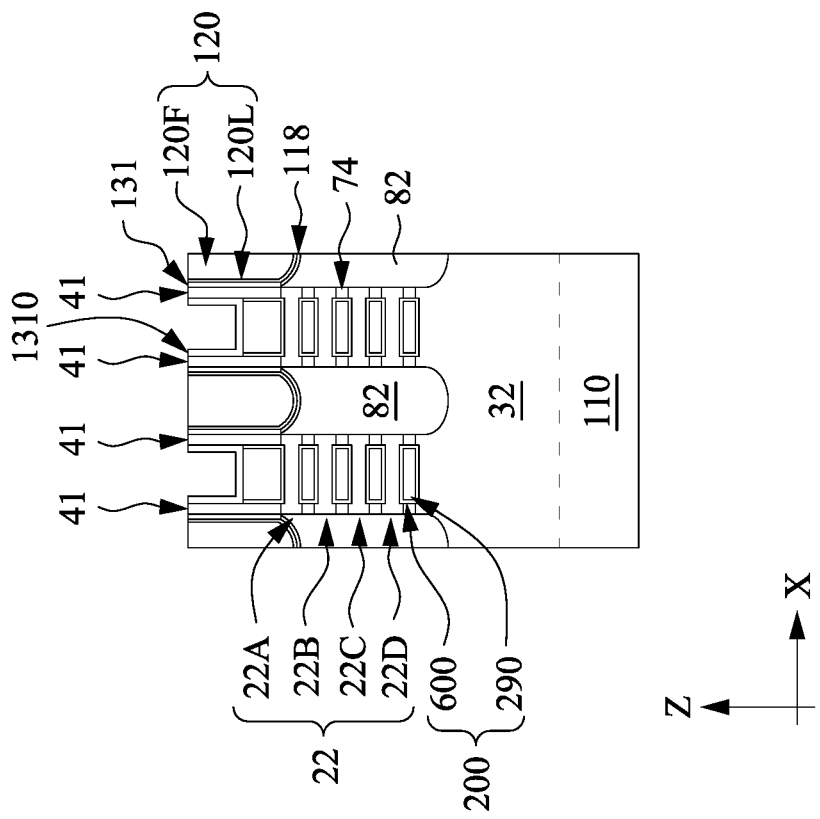

In FIG. 13C, following recessing of the gate structure 200 and removal of the second capping layer 295, corresponding to act 1700, 1800 of FIG. 15, the optional act 1900 is omitted, and the dummy liner layer 1310, which is substantially the same as the dummy liner layer 1210, is formed on exposed surfaces of the spacer layer 41 and the gate structure 200. FIG. 13C is similar in many respects to FIG. 12D. In FIG. 13C, because the spacer layer 41 and the ESL 131 are not recessed, the dummy liner layer 1310 is formed on vertical sidewalls of the spacer layer 41, whereas the dummy liner layer 1210 is formed on upper surfaces of the spacer layer 41. Formation of the dummy liner layer 1310 is substantially the same as formation of the dummy liner layer 1210, and description thereof is provided with reference to FIG. 12D. FIG. 13D is similar in many respects to FIG. 12E, and illustrates removal of horizontal portions of the dummy liner layer 1310 overlying the gate structure 200, which is substantially described with reference to FIG. 12E, and not repeated here.

Figure 13F:
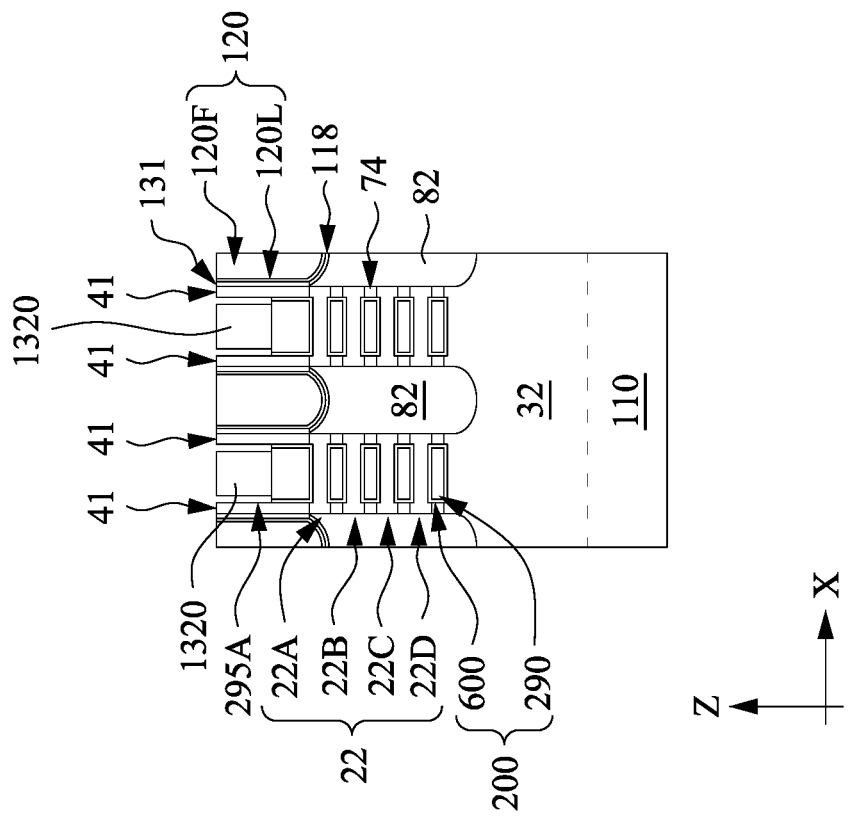
Figure 13E:
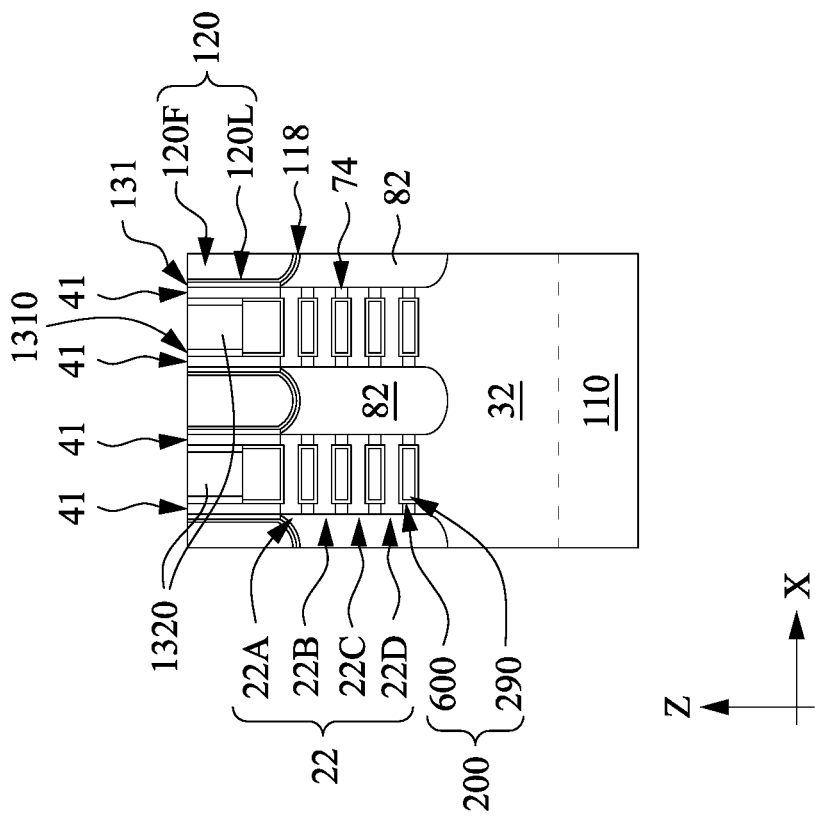

Formation of the second capping layer 1320 is illustrated in FIG. 13E, and formation of the air spacer 295A is illustrated in FIG. 13F. FIG. 13E is similar in many respects to FIG. 12F, and FIG. 13F is similar in many respects to FIG. 12G. The air spacer 295A may have dimensions that are similar to those of the air spacer 131A. The air spacer 295A is present between the spacer layer 41 the second capping layer 1320 and the gate structure 200. Dielectric constant of the air spacer 295A is less than that of the second capping layer 1320, such that the air spacer 295A reduces middle-end-of-line capacitance compared to configurations in which the space between the spacer layers 41 is completely filled by the second capping layer 295 or the second capping layer 1320.

Figure 13H:
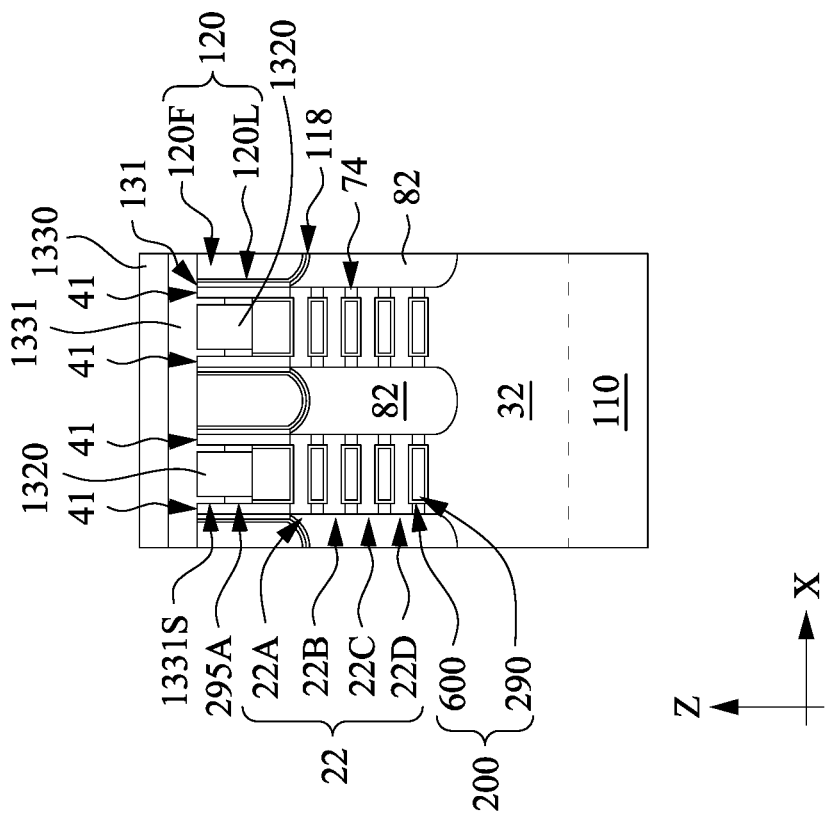
Figure 13G:
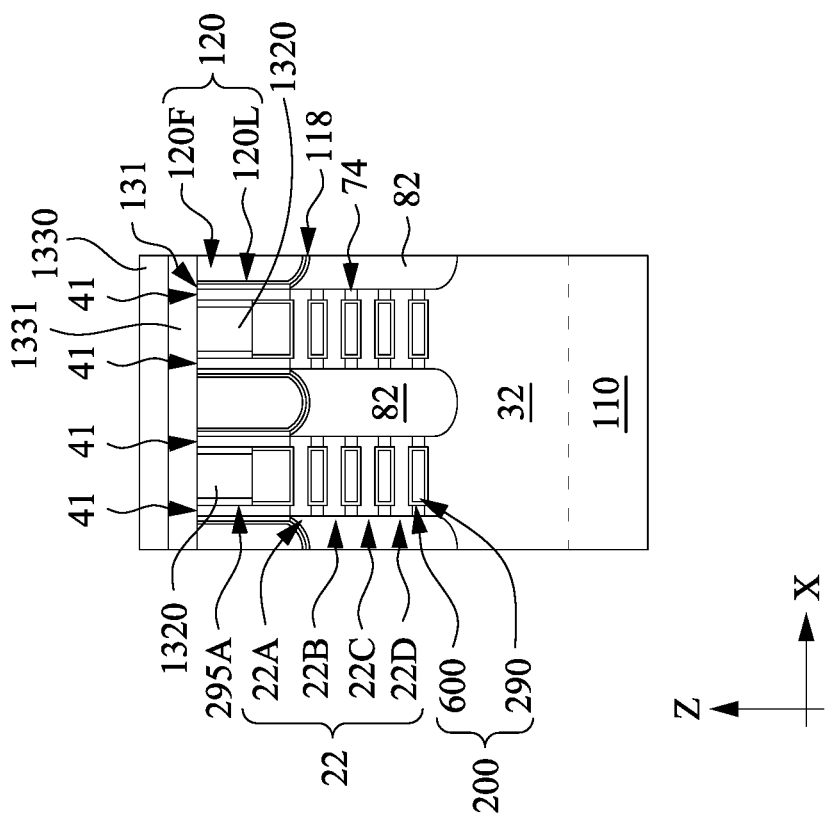

FIGS. 13G, 13H are similar in many respects to FIGS. 12H, 12I, respectively, and illustrate formation of the second ESL 1331 and the second ILD 1330 in accordance with various embodiments. In the embodiment shown in FIG. 13G, the second ESL 1331 does not significantly extend into the lateral space between the spacer layer 41 and the second capping layer 1320 occupied by the air spacer 295A. In the embodiment shown in FIG. 13H, the second ESL 1331 extends partially into the space between the spacer layer 41 and the second capping layer 1320. Extension portions 1331S of the second ESL 1331, which may also be referred to as "seal portions 1331S," are similar in many respects to the extension portions 1231S described with reference to FIG. 12I. The extension portions 1331S are in contact with sidewalls of the spacer layers 41 and sidewalls of the second capping layers 1320. Lower surfaces of the extension portions 1331S are separated from the gate structures 200 by the air spacers 295A. Sidewalls of the extension portions 1331S are separated from sidewalls of the liner layer 120L by the spacer layer 41 and the ESL 131.

Additional processing may be performed to finish fabrication of the GAA devices 20. For example, gate contacts (or gate vias, e.g., the gate via 184) may be formed to electrically couple to the gate structures 200. An interconnect structure may then be formed over the source/drain contacts 120 and the gate contacts. The interconnect structure may include a plurality of dielectric layers (including, for example, the second ILD 1230, 1330) surrounding metallic features, including conductive traces and conductive vias, which form electrical connection between devices on the substrate 110, such as the GAA devices 20, as well as to IC devices external to the IC device 10. In some embodiments, additional capping layers (not shown) are present over the source/drain contacts 120. Configurations in which only the second capping layers 1220, 1320 over the gate structures 200 are present (e.g., no second capping layers are present over the source/drain contacts 120) may be considered "single SAC" structures, and configurations in which the second capping layers 1220, 1320 and the additional capping layers over the gate structures 200 are both present may be considered "double SAC" structures.

Embodiments may provide advantages. Speed performance of devices including the air spacers 131A, 295A is increased by middle-end-of-line capacitance $C_{MEOL}$ reductions due to the low dielectric constant of the air spacers 131A, 295A which replace higher dielectric constant materials of the ESL 131 or the second capping layer 295, respectively. Replacement of the second capping layer 295 with a lower-k dielectric material of the second capping layers 1220, 1320 also reduces $C_{MEOL}$.

In accordance with at least one embodiment, a device includes a substrate, a gate structure, a capping layer, a source/drain region, a source/drain contact, and an air spacer. The gate structure wraps around at least one vertical stack of nanostructure channels over the substrate. The capping layer is on the gate structure. The source/drain region abuts the gate structure. The source/drain contact is on the source/drain region. The air spacer is between the capping layer and the source/drain contact.

In accordance with at least one embodiment, a device includes: a substrate; a first source/drain contact over the substrate; a second source/drain contact laterally offset from the first source/drain contact; a capping layer laterally between the first and second source/drain contacts; a first air spacer between the first source/drain contact and the capping layer; and a second air spacer between the second source/drain contact and the capping layer.

In accordance with at least one embodiment, a method includes: forming a gate structure over and wrapping around a vertical stack of nanostructures over a substrate; forming a first capping layer on the gate structure; removing the first capping layer; forming a liner layer on vertical sidewalls of source/drain contacts on either side of the gate structure; forming a second capping layer on the gate structure between the liner layer; and forming air spacers by removing the liner layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate;
a gate structure wrapping around at least one vertical stack of nanostructure channels over the substrate;
a capping layer on the gate structure;
a source/drain region abutting the gate structure;
a source/drain contact on the source/drain region; and
an air spacer positioned laterally between the capping layer and the source/drain contact, wherein the air spacer is entirely located within a vertical region defined by a lower boundary that is at or above a top surface of the gate structure and an upper boundary that is at or below a top surface of the capping layer.

2. The device of claim 1, comprising:
a spacer layer between the air spacer and the capping layer.

3. The device of claim 1, comprising:
a spacer layer below the air spacer and beside the gate structure.

4. The device of claim 1, comprising:
a dielectric layer over the capping layer and the air spacer.

5. The device of claim 4, wherein the dielectric layer includes:
an extension portion between the capping layer and the source/drain contact.

6. The device of claim 1, wherein the air spacer has width in a range of about 1 nanometer to about 5 nanometers.

7. The device of claim 1, wherein the air spacer has height in a range of about 5 nanometers to about 40 nanometers.

8. The device of claim 1, comprising a spacer layer in contact with the gate structure, wherein the spacer layer has different etch selectivity than the capping layer.

9. The device of claim 1, comprising a gate via extending through the capping layer to an upper surface of the gate structure.

10. The device of claim 1, comprising:
an etch stop layer between the gate structure and the source/drain contact, and between the air spacer and the source/drain region.

11. A device comprising:
a substrate;
a gate structure wrapping around at least one vertical stack of nanostructure channels over the substrate;
a first source/drain contact over the substrate;
a second source/drain contact laterally offset from the first source/drain contact;
a capping layer laterally between the first and second source/drain contacts;
a first air spacer positioned laterally between the first source/drain contact and the capping layer; and
a second air spacer positioned laterally between the second source/drain contact and the capping layer,
wherein each of the first and second air spacers is entirely located within a vertical region defined by a lower boundary that is at or above a top surface of the gate structure and an upper boundary that is at or below a top surface of the capping layer.

12. The device of claim 11, comprising:
a first etch stop layer between the first source/drain contact and the first air spacer; and
a second etch stop layer between the second source/drain contact and the second air spacer.

13. The device of claim 12, comprising:
a third etch stop layer overlying the first and second air spacers, including:
a first seal portion laterally between the capping layer and the first etch stop layer; and
a second seal portion laterally between the capping layer and the second etch stop layer.

14. The device of claim 13, wherein the first seal portion has height less than about 10 nanometers.

15. The device of claim 11, comprising:
a first spacer layer in contact with the gate structure and the capping layer; and
a second spacer layer in contact with the gate structure and the capping layer;
wherein upper surfaces of the gate structure, the first spacer layer and the second spacer layer are substantially coplanar.

16. A method, comprising:
forming a gate structure over and wrapping around a vertical stack of nanostructures over a substrate;
forming a first capping layer on the gate structure;
removing the first capping layer;
forming a liner layer on vertical sidewalls of source/drain contacts on either side of the gate structure;
forming a second capping layer on the gate structure between the liner layer; and
forming air spacers by removing the liner layer.

17. The method of claim 16, comprising:
sealing the air spacers by forming a first etch stop layer over the second capping layer, the source/drain contacts and the air spacers.

18. The method of claim 17, comprising:
recessing spacer layers on either side of the gate structure prior to forming the liner layer.

19. The method of claim 18, comprising:
recessing second etch stop layers on either side of the gate structure prior to forming the liner layer.

20. The method of claim 16, wherein the forming a second capping layer includes:
forming a second capping layer having lower dielectric constant than that of the first capping layer.

* * * * *